(12) United States Patent
Zhou et al.

(10) Patent No.: US 11,323,205 B2
(45) Date of Patent: May 3, 2022

(54) POLAR CODE ENCODING METHOD AND APPARATUS

(71) Applicant: Huawei Technologies Co., Ltd., Shenzhen (CN)

(72) Inventors: Yue Zhou, Hangzhou (CN); Rong Li, Hangzhou (CN); Hejia Luo, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 152 days.

(21) Appl. No.: 16/747,273

(22) Filed: Jan. 20, 2020

(65) Prior Publication Data

US 2020/0228238 A1 Jul. 16, 2020

Related U.S. Application Data

(63) Continuation of application No. PCT/CN2018/096316, filed on Jul. 19, 2018.

(30) Foreign Application Priority Data

Jul. 21, 2017 (CN) .......................... 201710601619.1

(51) Int. Cl.
*H04L 1/00* (2006.01)
*H03M 13/13* (2006.01)

(52) U.S. Cl.
CPC .......... *H04L 1/0057* (2013.01); *H03M 13/13* (2013.01)

(58) Field of Classification Search
CPC ..... H04L 1/0057; H04L 1/0043; H03M 13/13
See application file for complete search history.

(56) References Cited

U.S. PATENT DOCUMENTS 10,374,753 B2 8/2019 Shen et al.
10,523,368 B2 12/2019 Chen et al.

FOREIGN PATENT DOCUMENTS

| CN | 103023618 A | 4/2013 |
|---|---|---|
| CN | 104539393 A | 4/2015 |
| CN | 105743621 A | 7/2016 |
| CN | 105978577 A | 9/2016 |
| CN | 106452460 A | 2/2017 |

(Continued)

OTHER PUBLICATIONS

Liang, Z., "On the Investigation and Application of Decoding Algorithms of Polar Codes," Zhejiang University, 2017, 2 pages (with English Abstract).

(Continued)

*Primary Examiner* — Walter J Divito
(74) *Attorney, Agent, or Firm* — Slater Matsil, LLP

(57) ABSTRACT

A polar code encoding method and apparatus are provided, the method including obtaining a first sequence used to encode K to-be-encoded bits, where the first sequence comprises sequence numbers of N polar channels, where the sequence numbers of the N polar channels are arranged in the first sequence according to reliability of the N polar channels, where K is a positive integer, where N is a mother code length of a polar code, where N is a positive integer power of 2, and where K≤N, selecting sequence numbers of K polar channels from the first sequence in descending order of the reliability, and placing the to-be-encoded bits according to the selected sequence numbers of the K polar channels, and performing polar code encoding on the to-be-encoded bits.

20 Claims, 3 Drawing Sheets

(56) References Cited

FOREIGN PATENT DOCUMENTS

| CN | 106803759 A | 6/2017 |
|---|---|---|
| CN | 106877973 A | 6/2017 |
| EP | 3444980 A1 | 2/2019 |
| WO | 2015006947 A1 | 1/2015 |
| WO | 2015143593 A1 | 10/2015 |
| WO | 2017101631 A1 | 6/2017 |
| WO | 2018050063 A1 | 3/2018 |

OTHER PUBLICATIONS

"Construction Schemes for Polar Codes," Agenda Item: 8.1.4.2.1, Source: Huawei, HiSilicon, Document for: Discussion and Decision, 3GPP TSG RAN WG1 Meeting #88, R1-1701702, Athens, Greece, Feb. 13-17, 2017, 7 pages.

"Construction Schemes for Polar Codes," Agenda Item: 8.1.4.2.1, Source: Huawei, HiSilicon, Document for: Discussion and Decision, 3GPP TSG RAN WG1 Meeting #88, R1-1701702, Feb. 13-17, 2017, 8 pages.

"Theoretical Analysis of the Sequence Generation," Agenda Item: 8.1.1.2.1.2, Source: Huawei, HiSilicon, Document for: Discussion and Decision, 3GPP TSG RAN WG1 Meeting #88bis, R1-1705084, Apr. 3-7, 2017, 8 pages.

POLAR CODE ENCODING METHOD AND APPARATUS

CROSS-REFERENCE TO RELATED APPLICATIONS

This application is a continuation of International Application No. PCT/CN2018/096316, filed on Jul. 19, 2018, which claims priority to Chinese Patent Application No. 201710601619.1, filed on Jul. 21, 2017. The disclosures of the aforementioned applications are hereby incorporated by reference in their entireties.

TECHNICAL FIELD

Embodiments of this application relate to the field of communications technologies, and in particular, to a polar code encoding method and apparatus.

BACKGROUND

Channel coding, as a most fundamental wireless access technology, plays a vital role in ensuring reliable data transmission. In an existing wireless communications system, a turbo code, a low-density parity-check (LDPC) code, and a polar code are usually used to perform channel coding. The turbo code cannot support information transmission at an excessively low or high code rate. Due to encoding/decoding characteristics of the turbo code and the LDPC code, for medium and short packet transmission, it is difficult for the turbo code and the LDPC code to achieve ideal performance in case of a limited code length. In terms of implementation, the turbo code and the LDPC code have relatively high computation complexity in an encoding/decoding implementation process. The polar code is a high-performance code that has been theoretically proved to be capable of achieving a Shannon capacity and that has relatively low encoding/decoding complexity, and therefore is applied increasingly widely.

However, as the wireless communications system evolves rapidly, a future communications system such as a fifth generation (5G) communications system has some new characteristics. For example, three most typical communications scenarios include enhanced mobile broadband (eMBB), massive machine type communications (mMTC), and ultra-reliable and low latency communications (URLLC). A higher requirement is imposed for encoding/decoding performance of a polar code in these communications scenarios.

Reliability sorting of polar channels play a vital role in encoding/decoding performance of a polar code. However, in the current phase, accuracy of the reliability sorting of the polar channels is not ideal, affecting further improvement of the encoding/decoding performance of the polar code in an application process.

SUMMARY

Embodiments of this application provide a polar code encoding method and apparatus, to improve accuracy of reliability sorting of polar channels.

The specific technical solutions provided in the embodiments of this application are as follows:

According to a first aspect, a polar code encoding method is provided. To-be-encoded bits are obtained, where a length of the to-be-encoded bits is K, and K is a positive integer. A sequence used to encode the K to-be-encoded bits is obtained, and is denoted as a first sequence, where the first sequence is used to indicate sorting of reliability of N polar channels, the first sequence includes sequence numbers of the N polar channels, and the sequence numbers of the N polar channels are arranged in the first sequence based on the reliability of the N polar channels, where N is a mother code length of a polar code, N is a positive integer power of 2, and K≤N. First K sequence numbers for which reliability is sorted higher are selected from the first sequence in descending order of the reliability. The to-be-encoded bits are mapped to polar channels having the first K sequence numbers, and polar code encoding is performed on the to-be-encoded bits. In this way, locations of an information bit and a fixed bit are determined by computing reliability of a polar channel of a polar code, where the locations are not related to a channel parameter and a code rate. This can reduce computation complexity during the polar code encoding.

In a possible design, reliability of each polar channel in the N polar channels is obtained, where reliability of an $i^{th}$ polar channel in the N polar channels is determined by using a reliability computation formula in any one of the following possible designs. Optionally, the reliability of the polar channel may be computed online or may be computed offline and stored. Such sequence construction manners may be unrelated to a physical channel parameter, and therefore are convenient for offline storage.

In a possible design, the reliability of the $i^{th}$ polar channel in the N polar channels is determined by using a first reliability computation formula, and the first reliability computation formula is $W_i = \Sigma_{j=0}^{n-1} B_j \times (\Sigma_{\xi \in \Xi} C(\xi, j) \Psi(\xi, j)^{E(\xi)j})$, where $1 \leq i \leq N$, $W_i$ is the reliability of the $i^{th}$ polar channel, $n = \log_2 N$, i meets $i-1 = B_{n-1} B_{n-2} \ldots B_0$, where $B_{n-1} B_{n-2} \ldots B_1 B_0$ is a binary representation of i−1, $B_j$ is a value of a $j^{th}$ bit of a binary representation of a channel sequence number i, where $B_j \in \{0,1\}$, $\Xi$ E is a set of $\xi$ orders included in the first reliability computation formula, $C(\xi, j)$ is a function of $\xi$ and j, and represents a weight value of each order term, $\Psi(\xi, j)$ is a function of $\xi$ and j, and $E(\xi)$ is a function of $\xi$, and represents a frequency at which a $\xi^{th}$-order kernel function $\Psi(\xi, j)$ varies with j.

In a possible design, the reliability of the $i^{th}$ polar channel in the N polar channels is determined by using a second reliability computation formula, and the second reliability computation formula is $$W_i = \sum_{j=0}^{n-1} B_j \times \left( \sum_{\xi \in \Xi} C(\xi) \beta^{E(\xi)j} \right),$$

where $1 \leq i \leq N$, $W_i$ is the reliability of the $i^{th}$ polar channel, $n = \log_2 N$, i meets $i-1 = B_{n-1} B_{n-2} \ldots B_0$, where $B_{n-1} B_{n-2} \ldots B_1 B_0$ is a binary representation of i−1, $B_j$ is a value of a $j^{th}$ bit of a binary representation of a channel sequence number i, where $B_j \in \{0,1\}$, $\Xi$ is a set of $\xi$ orders included in the second reliability computation formula, $C(\xi)$ is a function of $\xi$, and represents a weight value of each order term, $\beta$ is a constant greater than 1; $E(\xi)$ is a function of $\xi$, and represents a frequency at which a $\xi^{th}$-order $\beta$ kernel varies with j.

In a possible design, the reliability of the $i^{th}$ polar channel in the N polar channels is determined by using a third reliability computation formula, and the third reliability computation formula is $$W_i = \sum_{j=0}^{n-1} B_j \times \left( \sum_{\xi \in \Xi} C(\xi) \beta^{\frac{1}{4\xi} j} \right),$$

where $1 \leq i \leq N$, $W_i$ is the reliability of the $i^{th}$ polar channel, $n = \text{Log}_2 N$, $i$ meets $i-1 = B_{n-1} B_{n-2} \ldots B_0$, where $B_{n-1} B_{n-2} \ldots B_1 B_0$ is a binary representation of $i-1$, $B_j$ is a value of a $j^{th}$ bit of a binary representation of a channel sequence number $i$, where $B_j \in \{0,1\}$, $\Xi$ is a set of $\xi$ orders included in the third reliability computation formula, $C(\xi)$ is a function of $\xi$, and represents a weight value of each order term, and $\beta$ is a constant greater than 1.

In a possible design, the reliability of the $i^{th}$ polar channel in the N polar channels is determined by using a fourth reliability computation formula, and the fourth reliability computation formula is $$W_i = \sum_{j=0}^{n-1} B_j \times \left( \sum_{\xi \in \Xi_1, \xi \notin \Xi_2} C(\xi) \beta^{E(\xi) j} + \sum_{\xi \in \Xi_2, \xi \notin \Xi_1} C(\xi) \Psi(\xi, j)^{E(\xi) j} \right),$$

where $1 \leq i \leq N$, $W_i$ is the reliability of the $i^{th}$ polar channel, $n = \text{Log}_2 N$, $i$ meets $i-1 = B_{n-1} B_{n-2} \ldots B_0$, where $B_{n-1} B_{n-2} \ldots B_0$ is a binary representation of $i-1$, $B_j$ is a value of a $j^{th}$ bit of a binary representation of a channel sequence number $i$, where $B_j \in \{0,1\}$, $\Xi$ and $\Xi_2$ are sets of $\xi$ orders in the fourth reliability computation formula, $C(\xi)$ is a function of $\xi$, and represents a weight value of each order term, $\Psi(\xi, j)$ is a function of $\xi$ and $j$, $\beta$ is a constant greater than 1, $E(\xi)$ is a function of $\xi$, and represents a frequency at which a $\xi^{th}$-order $\beta$ kernel varies with $j$ or a frequency at which a $\xi^{th}$-order kernel function $\Psi(\xi, j)$ varies with $j$.

In a possible design, the reliability of the $i^{th}$ polar channel in the N polar channels is determined by using a fifth reliability computation formula, and the fifth reliability computation formula is $$W_i = \sum_{j=0}^{n-1} B_j \times (C(j) \times \Psi(j)^{E \times j}),$$

where $1 \leq i \leq N$, $W_i$ is the reliability of the $i^{th}$ polar channel, $n = \text{Log}_2 N$, $i$ meets $i-1 = B_{n-1} B_{n-2} \ldots B_0$, where $B_{n-1} B_{n-2} \ldots B_1 B_0$ is a binary representation of $i-1$, $B_j$ is a value of a $j^{th}$ bit of a binary representation of a channel sequence number $i$, where $B_j \in \{0,1\}$, $C(j)$ is a constant, and is a coefficient for each binary kernel function, and $E$ is a constant, and describes a frequency at which a kernel function $\Psi(j)$ varies with $j$, where the kernel function $\Psi(j)$ is a function of a binary representation bit $j$ of the channel sequence number $i$.

In a possible design, the reliability of the $i^{th}$ polar channel in the N polar channels meets a sixth reliability computation formula, and the sixth reliability computation formula is:

$$W_i = \sum_{j=0}^{n-1} \left( B_j \times (\beta^j + a \times b^j) + \left( \prod_{k \in K} B_k \right) \times B_j \times (\beta^j + c \times d^j) \right),$$

where $1 \leq i \leq N$, $W_i$ is the reliability of the $i^{th}$ polar channel, $n = \text{Log}_2 N$, $i$ meets $i-1 = B_{n-1} B_{n-2} \ldots B_0$, where $B_{n-1} B_{n-2} \ldots B_1 B_0$ is a binary representation of $i-1$, $B_j$ is a value of a $j^{th}$ bit of a binary representation of a channel sequence number $i$, where $B_j \in \{0,1\}$, $\beta$ is a constant greater than 1, K is a set binary representation bits of the channel sequence number, to be specific, elements include 0 to n-1, where K is a subset of a set $\{0, 1, \ldots, n-1\}$, a size of the set meets $0 \leq \text{Size}(K) \leq n-1$, if m exists in the set K, sorting of channel sequence numbers from 0 to $2^m - 1$ is inconsistent with sorting of channel sequence numbers from $2^m$ to $2^{m+1} - 1$ in the sequence, and the elements in the set K changes symmetry characteristics of the sequence, and a and c are respectively weights of kernel functions b and d.

In a possible design, $\beta = 2^{1/4}$.

In a possible design, a value range of the polar channel sequence number $i$ is $0 \leq i \leq N-1$. In this case, $B_{n-1} B_{n-2} \ldots B_1 B_0$ the foregoing possible designs is the binary representation of $i$.

Computing the reliability of the $i^{th}$ polar channel in the N polar channels by using any form of formula above may help improve evaluation accuracy of polar channel reliability, thereby improving encoding/decoding performance of a polar code.

In a possible design, the first sequence is a second sequence or a subset of a second sequence, the second sequence includes sequence numbers of $N_{max}$ polar channels, and the sequence numbers of the $N_{max}$ polar channels are arranged in the second sequence based on reliability of the $N_{max}$ polar channels, where $N_{max}$ is a positive integer power of 2, and $N_{max} \geq N$. $N_{max}$ is a maximum mother code length of the polar code, for example, $N_{max} = 1024$, or $N_{max} = 512$. A sequence needs to meet a nesting characteristic. Therefore, when the second sequence having the maximum mother code length is determined, another sequence having a relatively short mother code length may be obtained based on the second sequence.

In a possible design, the second sequence may be determined by using a formula in any one of the foregoing possible designs, provided that N in the formula is replaced with $N_{max}$.

In a possible design, when $a = -0.22$, $b = 1.2$, $c = 0.26$, $d = 1$, $f = 0$, $g = 1$, and $\Xi = \{0, 1\}$, the first reliability computation formula may be embodied as $$W_i = \sum_{j=0}^{n-1} B_j \times (1.2^j + 0.26 \times (0.98^j)).$$

The embodied formula is used to compute reliability of a polar channel. When $N = 1024$, the first sequence is the following sequence, or when $N_{max} = 1024$, the second sequence may also be the following sequence, where polar channel sequence numbers start from 1:

[1, 2, 3, 5, 9, 17, 4, 33, 6, 7, 65, 10, 11, 18, 13, 19, 129, 34, 21, 35, 25, 8, 37, 66, 257, 67, 12, 41, 69, 14, 20, 49, 130, 15, 73, 22, 131, 513, 36, 23, 133, 81, 26, 38, 27, 258, 137, 39, 68, 97, 42, 259, 29, 145, 43, 70, 261, 50, 71, 16, 45, 74, 51, 265, 132, 161, 514, 75, 24, 53, 134, 82, 515, 273, 77, 135, 83, 28, 57, 193, 138, 517, 40, 98, 85, 260, 30, 139, 289, 521, 146, 99, 44, 31, 262, 141, 89, 147, 72, 101, 46, 263, 529, 321, 52, 266, 162, 149, 47, 76, 105, 267, 54, 163, 516, 274, 153, 545, 78, 55, 269, 136, 165, 84, 113, 58, 194, 275, 518, 385, 79, 59, 86, 195, 140, 290, 169, 519, 277, 577, 522, 100, 87, 32, 291, 61, 197, 142, 90, 523, 281, 148, 177, 102, 264, 143, 293, 530, 91, 322, 201, 525, 150, 103, 48, 531, 106, 641, 323, 93, 268, 297, 164, 151, 209, 154, 546, 107, 533, 325, 56, 270, 166, 114, 276, 155, 547, 305, 386, 80, 109, 271, 537, 167, 115, 329, 60, 196, 225, 170, 520, 278, 387, 157, 549, 578, 769, 88, 117, 292, 62, 171, 198, 279, 389, 579, 337, 524, 282, 553, 178, 63, 199, 144, 294, 173, 92, 121, 202, 283, 581, 526, 179, 393, 104, 295, 532, 561, 642, 324, 94, 203, 353, 298, 527, 285, 152, 181, 585, 210, 108, 534, 643, 401, 95, 299, 326, 205, 211, 156, 548, 306, 185, 535, 110, 645, 327, 272, 593, 301, 538, 168, 116, 330, 226, 307, 213, 388, 158, 550, 417, 111, 539, 770, 649, 331, 118, 227, 172, 280, 159, 551, 309, 390, 580, 338, 217, 609, 554, 771, 541, 119, 333, 64, 200, 229, 174, 391, 122, 657, 339, 284, 555, 313, 582, 449, 180, 394, 773, 296, 175, 562, 123, 204, 354, 233, 583, 341, 528, 286, 395, 557, 182, 586, 563, 777, 644, 402, 96, 673, 355, 125, 300, 206, 287, 183, 397, 587, 345, 212, 241, 186, 536, 403, 565, 646, 328, 207, 357, 594, 302, 785, 589, 308, 187, 214, 418, 112, 647, 405, 595, 303, 540, 569, 705, 650, 332, 361, 228, 215, 160, 552, 310, 419, 189, 218, 610, 597, 772, 542, 651, 409, 801, 120, 334, 230, 311, 392, 421, 658, 340, 219, 611, 369, 556, 314, 450, 543, 774, 653, 335, 601, 231, 176, 124, 659, 234, 315, 584, 342, 451, 221, 613, 396, 558, 425, 775, 833, 564, 778, 674, 356, 126, 235, 661, 343, 288, 559, 317, 453, 184, 398, 588, 346, 617, 242, 779, 404, 566, 675, 433, 127, 208, 358, 237, 399, 786, 665, 347, 590, 243, 457, 188, 567, 781, 648, 406, 677, 359, 596, 304, 625, 570, 706, 787, 362, 897, 591, 349, 216, 245, 420, 190, 407, 571, 598, 707, 465, 652, 410, 802, 681, 363, 789, 312, 191, 422, 220, 612, 370, 249, 599, 544, 411, 803, 573, 709, 654, 336, 365, 602, 232, 793, 423, 660, 689, 371, 316, 452, 222, 614, 481, 426, 776, 655, 413, 805, 603, 834, 713, 236, 662, 344, 223, 615, 373, 560, 318, 427, 454, 618, 835, 605, 780, 809, 676, 434, 128, 663, 238, 319, 455, 400, 721, 429, 666, 348, 619, 377, 244, 458, 837, 568, 782, 435, 678, 360, 239, 626, 788, 667, 817, 898, 592, 350, 459, 621, 246, 783, 408, 679, 437, 627, 841, 572, 708, 466, 737, 682, 364, 790, 899, 669, 351, 247, 461, 192, 250, 600, 467, 629, 412, 804, 574, 683, 441, 710, 791, 366, 901, 849, 794, 424, 690, 372, 251, 482, 575, 711, 469, 656, 414, 806, 685, 367, 604, 633, 714, 795, 691, 905, 224, 616, 374, 483, 253, 428, 415, 807, 836, 606, 715, 473, 865, 810, 797, 664, 693, 375, 320, 456, 485, 722, 430, 620, 378, 913, 607, 811, 838, 717, 436, 240, 723, 431, 668, 818, 697, 379, 460, 622, 489, 839, 784, 813, 680, 438, 628, 842, 738, 819, 725, 900, 670, 352, 929, 623, 381, 248, 462, 439, 843, 468, 630, 739, 497, 684, 442, 792, 671, 821, 902, 463, 850, 729, 252, 631, 845, 576, 443, 712, 470, 741, 686, 368, 903, 634, 851, 796, 825, 961, 692, 906, 484, 254, 471, 416, 808, 687, 445, 635, 716, 474, 866, 745, 853, 798, 907, 694, 376, 255, 486, 914, 608, 475, 867, 637, 812, 718, 799, 695, 909, 857, 487, 724, 432, 753, 698, 380, 915, 490, 840, 719, 477, 869, 814, 820, 699, 726, 930, 624, 382, 491, 917, 815, 440, 844, 873, 740, 498, 727, 672, 822, 931, 701, 383, 464, 493, 730, 921, 632, 846, 499, 444, 742, 823, 904, 933, 852, 731, 881, 826, 962, 847, 472, 743, 501, 688, 446, 636, 746, 827, 854, 963, 733, 908, 937, 256, 447, 476, 868, 638, 747, 505, 855, 800, 829, 965, 696, 910, 858, 488, 754, 916, 945, 639, 720, 478, 870, 749, 911, 859, 755, 969, 700, 492, 918, 479, 871, 816, 874, 861, 728, 757, 932, 702, 384, 919, 494, 977, 922, 875, 500, 824, 703, 934, 495, 732, 882, 761, 923, 848, 877, 744, 502, 935, 883, 828, 964, 734, 993, 938, 925, 503, 448, 748, 506, 856, 735, 885, 830, 939, 966, 946, 640, 507, 750, 831, 967, 912, 941, 860, 889, 756, 970, 947, 480, 872, 751, 509, 862, 971, 758, 920, 949, 978, 876, 863, 759, 973, 704, 496, 762, 979, 924, 953, 878, 936, 884, 763, 994, 981, 926, 879, 504, 736, 886, 995, 765, 940, 927, 985, 508, 887, 832, 968, 997, 942, 890, 948, 752, 510, 943, 891, 972, 1001, 950, 511, 864, 893, 760, 974, 951, 980, 1009, 954, 975, 764, 955, 982, 880, 996, 766, 983, 928, 957, 986, 888, 767, 998, 987, 999, 944, 892, 1002, 989, 512, 894, 1003, 952, 1010, 895, 976, 1005, 1011, 956, 984, 1013, 958, 768, 959, 988, 1017, 1000, 990, 1004, 991, 896, 1006, 1012, 1007, 1014, 1015, 960, 1018, 1019, 992, 1021, 1008, 1016, 1020, 1022, 1023, 1024].

In a possible design, when $\Xi=\{0,1\}$ includes a zeroth-order term and a first-order term, and a coefficient is defined as $$C(\xi) = \frac{1}{4\xi},$$

the second reliability computation formula may be embodied as $$W_i = \sum_{j=0}^{n-1} B_j \times \left(\beta^j + \frac{1}{4}\beta^{\frac{1}{4}j}\right).$$

The embodied formula is used to compute reliability of a polar channel. When N=1024, the first sequence is the following sequence, or when $N_{max}=1024$, the second sequence may also be the following sequence, where polar channel sequence numbers start from 1:

[1, 2, 3, 5, 9, 17, 33, 4, 6, 7, 65, 10, 11, 18, 13, 129, 19, 34, 21, 35, 25, 257, 37, 8, 66, 67, 41, 12, 69, 14, 130, 49, 20, 15, 73, 513, 131, 22, 133, 36, 23, 81, 26, 258, 38, 137, 27, 259, 39, 97, 68, 42, 29, 145, 261, 70, 43, 50, 71, 265, 45, 16, 74, 514, 161, 132, 51, 75, 515, 134, 273, 53, 24, 82, 77, 517, 135, 193, 83, 138, 57, 28, 289, 260, 40, 98, 521, 139, 85, 30, 146, 262, 99, 141, 44, 31, 89, 529, 147, 263, 321, 101, 72, 266, 46, 162, 149, 52, 267, 47, 105, 545, 76, 516, 163, 274, 54, 153, 269, 385, 78, 518, 165, 136, 275, 194, 55, 113, 84, 58, 79, 519, 577, 290, 195, 277, 522, 169, 140, 86, 59, 291, 197, 100, 523, 87, 142, 281, 61, 32, 90, 530, 177, 148, 293, 264, 322, 102, 525, 143, 201, 641, 91, 531, 150, 323, 103, 297, 268, 48, 106, 546, 164, 93, 533, 151, 209, 325, 154, 270, 107, 547, 386, 166, 305, 276, 56, 114, 537, 155, 271, 329, 769, 109, 549, 387, 80, 520, 167, 578, 225, 196, 278, 115, 170, 157, 60, 579, 389, 292, 553, 279, 198, 524, 337, 171, 117, 88, 282, 62, 178, 581, 294, 199, 393, 526, 173, 144, 283, 202, 642, 63, 121, 561, 92, 532, 179, 295, 353, 324, 104, 527, 585, 298, 203, 643, 285, 401, 94, 534, 181, 152, 210, 326, 299, 205, 108, 645, 548, 95, 535, 593, 306, 211, 538, 327, 185, 156, 301, 272, 330, 770, 417, 110, 550, 388, 168, 307, 226, 649, 213, 116, 539, 158, 331, 771, 111, 551, 609, 580, 390, 227, 309, 554, 280, 338, 172, 118, 541, 159, 217, 657, 333, 773, 391, 449, 582, 229, 555, 200, 339, 394, 119, 174, 313, 284, 64, 122, 562, 180, 583, 296, 354, 777, 557, 395, 528, 341, 175, 586, 233, 673, 204, 644, 286, 123, 563, 402, 182, 355, 587, 397, 300, 287, 206, 646, 345, 785, 125, 565, 403, 96, 536, 183, 594, 241, 212, 357, 328, 186, 589, 302, 207, 647, 705, 418, 595, 405, 308, 650, 569, 214, 540, 187, 303, 361, 801, 332, 772, 419, 112, 552, 610, 228, 651, 597, 310, 215, 409, 542, 189, 160, 218, 658, 334, 774, 611, 421, 392, 450, 311, 230, 653, 556, 369, 340, 120, 543, 601, 314, 219, 659, 335, 775, 833, 613, 451, 584, 231, 778, 425, 558, 396, 342, 176, 315, 234, 674, 221, 124, 661, 564, 453, 356, 779, 559, 617, 343, 588, 398, 235, 675, 317, 288, 346, 786, 433, 126, 566, 404, 184, 242, 665, 358, 781, 399, 457, 897, 590, 237, 677, 208, 648, 347, 787, 706, 127, 567, 625, 596, 406, 243, 570, 359, 188, 591, 304, 362, 802, 707, 420, 349, 789, 681, 407, 652, 465, 598, 245, 571, 216, 410, 190, 363, 803, 709, 612, 422, 599, 312, 654, 370, 793, 573, 411, 544, 191, 602, 249, 689, 220, 660, 365, 805, 336, 776, 423, 834, 481, 614, 452, 232, 655, 371, 713, 426, 603, 413, 316, 222, 662, 835, 615, 809, 454, 780, 427, 560, 373, 618, 344, 236, 676, 605, 318, 223, 663, 721, 434, 837, 666, 455, 782, 619, 429, 400, 458, 898, 319, 238, 678, 377, 817, 348, 788, 435, 128, 568, 626, 244, 667, 360, 783, 841, 621, 459, 899, 592, 239, 679, 737, 708, 350, 790, 627, 437, 682, 408, 466, 246, 669, 572, 461, 364, 901, 804, 351, 791, 710, 849, 683, 629, 467, 600, 247, 794, 441, 574, 412, 192, 250, 690, 366, 806, 711, 424, 482, 905, 685, 656, 469, 372, 795, 714, 575, 633, 604, 414, 251, 691, 367, 807, 865, 836, 483, 616, 810, 715, 428, 374, 797, 415, 473, 913, 606, 253, 693, 224, 664, 722, 838, 485, 811, 456, 375, 717, 620, 430, 607, 320, 378, 818, 723, 436, 839, 697, 668, 813, 784, 431, 842, 489, 929, 622, 460, 900, 240, 680, 379, 819, 738, 725, 628, 438, 670, 843, 623, 462, 902, 739, 381, 821, 352, 792, 439, 850, 684, 497, 630, 468, 248, 671, 729, 442, 845, 463, 903, 961, 741, 712, 851, 906, 631, 686, 825, 470, 796, 443, 576, 634, 252, 692, 368, 808, 866, 484, 907, 853, 687, 745, 471, 716, 798, 635, 445, 416, 474, 914, 254, 694, 867, 486, 909, 812, 376, 799, 718, 857, 637, 475, 915, 608, 255, 695, 753, 724, 869, 840, 698, 487, 814, 719, 432, 490, 930, 477, 380, 917, 820, 726, 699, 815, 873, 844, 491, 931, 624, 740, 382, 822, 727, 440, 498, 921, 701, 672, 730, 846, 493, 933, 464, 904, 962, 383, 823, 742, 881, 852, 499, 632, 826, 731, 444, 847, 963, 743, 937, 908, 854, 688, 501, 827, 746, 472, 733, 636, 446, 965, 868, 855, 910, 747, 829, 800, 447, 858, 505, 945, 638, 476, 916, 256, 696, 754, 870, 488, 911, 969, 749, 720, 859, 639, 478, 918, 755, 871, 700, 816, 874, 492, 932, 861, 479, 919, 977, 757, 728, 922, 702, 875, 494, 934, 384, 824, 882, 500, 923, 703, 761, 732, 877, 848, 495, 935, 993, 964, 744, 883, 938, 502, 925, 828, 734, 966, 939, 885, 856, 503, 748, 830, 735, 448, 506, 946, 967, 941, 912, 970, 831, 750, 889, 860, 507, 947, 640, 756, 872, 971, 751, 862, 509, 949, 480, 920, 978, 758, 973, 876, 863, 979, 759, 953, 924, 704, 762, 878, 496, 936, 994, 981, 884, 926, 763, 879, 995, 940, 886, 504, 927, 985, 765, 736, 997, 968, 887, 942, 832, 890, 508, 948, 943, 1001, 972, 752, 891, 510, 950, 974, 893, 864, 511, 951, 1009, 980, 760, 954, 975, 982, 955, 764, 880, 996, 983, 957, 928, 986, 766, 998, 888, 987, 767, 999, 944, 1002, 989, 892, 1003, 894, 512, 952, 1010, 1005, 976, 895, 1011, 956, 1013, 984, 958, 959, 1017, 988, 768, 1000, 990, 1004, 991, 1006, 896, 1012, 1007, 1014, 1015, 960, 1018, 1019, 1021, 992, 1008, 1016, 1020, 1022, 1023, 1024].

In a possible design, when $\Xi=\{0,1,2\}$ includes a zeroth-order term, a first-order term, a second-order term, and a coefficient is defined as $$C(\xi) = \frac{1}{4\xi},$$

the third reliability computation formula may be embodied as $$W_i = \sum_{j=0}^{n-1} B_j \times \left(\beta^j + \frac{1}{4}\beta^{\frac{1}{4}j} + \frac{1}{16}\beta^{\frac{1}{16}j}\right).$$

The embodied formula is used to compute reliability of a polar channel. When N=1024, the first sequence is the following sequence, or when $N_{max}$=1024, the second sequence may also be the following sequence, where polar channel sequence numbers start from 1:

[1, 2, 3, 5, 9, 17, 33, 4, 6, 65, 7, 10, 11, 18, 129, 13, 19, 34, 21, 35, 25, 257, 37, 66, 8, 67, 41, 12, 69, 130, 14, 49, 20, 513, 73, 131, 15, 22, 133, 36, 81, 23, 26, 258, 137, 38, 27, 259, 97, 39, 68, 42, 145, 29, 261, 70, 43, 50, 265, 71, 514, 161, 45, 74, 132, 16, 51, 515, 75, 273, 134, 53, 82, 24, 517, 193, 77, 135, 83, 138, 57, 289, 28, 521, 260, 98, 139, 40, 85, 146, 30, 262, 99, 141, 529, 44, 89, 321, 147, 31, 263, 101, 266, 72, 162, 46, 149, 52, 545, 267, 105, 516, 163, 47, 76, 274, 153, 54, 385, 269, 518, 165, 275, 194, 78, 113, 136, 55, 84, 577, 519, 58, 290, 195, 79, 277, 522, 169, 140, 86, 59, 291, 523, 197, 100, 281, 87, 142, 530, 177, 61, 90, 293, 322, 148, 641, 32, 525, 264, 201, 102, 143, 531, 91, 323, 150, 297, 103, 546, 268, 533, 106, 164, 209, 48, 93, 325, 151, 547, 154, 386, 270, 107, 305, 166, 537, 276, 769, 114, 329, 155, 56, 549, 387, 271, 578, 225, 109, 520, 167, 196, 80, 278, 115, 170, 157, 579, 389, 60, 553, 292, 337, 279, 524, 198, 171, 117, 282, 88, 581, 178, 62, 393, 294, 199, 642, 526, 173, 561, 283, 202, 121, 144, 532, 353, 179, 63, 92, 295, 585, 324, 643, 527, 298, 203, 104, 401, 285, 534, 181, 210, 94, 326, 152, 645, 299, 205, 548, 593, 535, 108, 306, 211, 95, 538, 327, 185, 770, 417, 301, 330, 156, 649, 550, 388, 272, 307, 226, 110, 168, 539, 213, 771, 116, 609, 331, 551, 158, 580, 390, 227, 111, 309, 554, 338, 657, 541, 280, 773, 172, 217, 118, 449, 333, 159, 391, 582, 555, 229, 339, 394, 200, 313, 119, 174, 562, 284, 777, 583, 122, 354, 180, 673, 64, 557, 395, 296, 341, 586, 233, 644, 528, 175, 563, 204, 402, 286, 123, 355, 182, 587, 397, 785, 646, 300, 345, 565, 403, 287, 206, 594, 241, 125, 536, 357, 183, 212, 705, 96, 589, 328, 647, 186, 418, 302, 207, 595, 405, 650, 569, 308, 801, 540, 214, 361, 187, 772, 419, 303, 610, 332, 651, 552, 597, 228, 112, 409, 310, 215, 658, 542, 189, 774, 611, 218, 421, 450, 334, 160, 653, 369, 392, 311, 556, 230, 601, 340, 833, 659, 543, 775, 314, 219, 120, 613, 451, 335, 778, 425, 584, 231, 674, 558, 396, 342, 661, 315, 234, 176, 221, 564, 779, 453, 124, 617, 356, 675, 559, 343, 588, 398, 235, 786, 433, 317, 346, 665, 566, 404, 897, 288, 781, 242, 126, 457, 358, 184, 677, 399, 787, 706, 590, 237, 625, 648, 347, 567, 208, 596, 406, 243, 127, 570, 359, 802, 707, 591, 789, 362, 188, 681, 420, 465, 304, 349, 407, 652, 598, 571, 245, 803, 410, 216, 709, 363, 190, 612, 422, 793, 599, 654, 370, 689, 573, 411, 312, 602, 805, 249, 834, 660, 544, 481, 365, 191, 776, 220, 423, 713, 614, 452, 336, 655, 371, 426, 232, 603, 413, 835, 662, 316, 809, 615, 222, 780, 454, 427, 373, 618, 676, 721, 560, 605, 344, 837, 663, 236, 434, 318, 223, 666, 455, 898, 782, 619, 429, 817, 458, 678, 377, 400, 788, 435, 319, 238, 626, 348, 841, 667, 568, 899, 783, 244, 737, 128, 621, 459, 360, 679, 708, 592, 239, 790, 627, 437, 682, 466, 350, 669, 408, 901, 572, 246, 461, 804, 849, 791, 710, 364, 683, 629, 467, 351, 794, 441, 600, 247, 690, 574, 412, 905, 806, 711, 250, 482, 366, 192, 685, 424, 795, 469, 714, 633, 656, 372, 865, 691, 575, 604, 807, 414, 251, 836, 483, 367, 810, 715, 616, 913, 797, 428, 473, 374, 693, 415, 722, 606, 253, 838, 664, 811, 485, 224, 717, 456, 375, 620, 430, 818, 723, 607, 839, 378, 697, 436, 929, 320, 813, 842, 668, 489, 900, 784, 431, 819, 738, 622, 460, 680, 725, 379, 240, 628, 438, 843, 670, 902, 739, 623, 821, 462, 850, 497, 381, 792, 439, 684, 729, 630, 468, 961, 352, 845, 671, 903, 442, 248, 741, 463, 851, 906, 712, 825, 631, 686, 796, 470, 443, 634, 866, 692, 576, 907, 808, 853, 252, 745, 484, 368, 687, 471, 716, 914, 798, 635, 445, 867, 474, 694, 416, 909, 254, 812, 486, 857, 915, 799, 718, 753, 637, 475, 376, 869, 695, 724, 608, 255, 840, 698, 487, 930, 814, 719, 917, 490, 432, 477, 820, 726, 380, 873, 699, 931, 815, 844, 491, 740, 624, 921, 822, 727, 498, 382, 701, 440, 730, 933, 962, 846, 672, 493, 881, 904, 823, 742, 464, 852, 499, 383, 826, 731, 632, 963, 847, 444, 937, 743, 908, 854, 827, 501, 746, 688, 733, 472, 965, 636, 446, 868, 855, 910, 747, 945, 829, 858, 505, 916, 800, 447, 754, 638, 476, 969, 870, 696, 911, 256, 749, 488, 859, 720, 918, 755, 639, 871, 478, 874, 700, 932, 977, 816, 861, 919, 492, 757, 479, 922, 728, 875, 702, 934, 494, 882, 923, 824, 761, 500, 993, 384, 877, 703, 732, 935, 964, 848, 495, 883, 938, 744, 925, 828, 502, 734, 966, 939, 885, 856, 503, 748, 946, 830, 735, 967, 506, 448, 941, 970, 889, 912, 947, 831, 750, 860, 507, 756, 640, 971, 872, 751, 949, 978, 862, 509, 920, 758, 480, 973, 876, 979, 863, 953, 759, 924, 762, 994, 878, 704, 936, 981, 496, 884, 926, 763, 995, 879, 940, 985, 886, 927, 765, 504, 997, 736, 968, 887, 942, 890, 948, 832, 508, 1001, 943, 972, 891, 752, 950, 510, 974, 1009, 893, 951, 980, 864, 511, 954, 760, 975, 982, 955, 764, 996, 880, 983, 957, 986, 928, 766, 998, 987, 888, 767, 999, 1002, 944, 989, 892, 1003, 1010, 894, 952, 512, 1005, 976, 1011, 895, 956, 1013, 984, 958, 1017, 959, 988, 768, 1000, 990, 1004, 991, 1006, 1012, 896, 1007, 1014, 1015, 1018, 960, 1019, 1021, 992, 1008, 1016, 1020, 1022, 1023, 1024].

In a possible design, for a set in which ξ only belongs to $\Xi_1$, a kernel function of the set is β. For $W_i=\Sigma_{j=0}^{n-1}B_j\times(\beta^j+a\times b^j)$, for example, when ξ=1, C(1)=1, Ψ(1)=β=$2^{1/4}$=1.1892, and E(1)=1, and when ξ=2, C(2)=0.17, Ψ(2)=0.63, and E(1)=¼, or C(2)=0.17, Ψ(2)=0.8909, and E(1)=1. The fourth reliability computation formula may be embodied as $$W_i = \sum_{j=0}^{n-1} B_j \times \left(\beta^j + 0.17 \times 0.63^{\frac{1}{4}j}\right), \text{ or } W_i = \sum_{j=0}^{n-1} B_j \times (\beta^j + 0.17 \times 0.8909^j).$$

The embodied formula is used to compute reliability of a polar channel. When N=1024, the first sequence is the following sequence, or when $N_{max}$=1024, the second sequence may also be the following sequence, where polar channel sequence numbers start from 1:

[1, 2, 3, 5, 9, 17, 33, 4, 6, 7, 65, 10, 11, 18, 13, 129, 19, 34, 21, 35, 25, 37, 8, 257, 66, 67, 41, 12, 69, 14, 49, 130, 20, 15, 73, 131, 513, 22, 36, 133, 23, 81, 26, 38, 258, 137, 27, 39, 97, 259, 68, 42, 29, 145, 43, 261, 70, 50, 71, 45, 16, 265, 74, 161, 51, 132, 514, 75, 53, 515, 134, 24, 273, 82, 77, 135, 193, 83, 517, 57, 138, 28, 40, 289, 98, 85, 260, 139, 521, 30, 146, 99, 44, 262, 141, 31, 89, 147, 529, 101, 263, 72, 321, 46, 266, 162, 52, 149, 47, 105, 267, 76, 163, 545, 54, 516, 274, 153, 269, 78, 165, 55, 113, 136, 385, 275, 194, 84, 518, 58, 79, 195, 519, 290, 169, 59, 277, 577, 86, 140, 522, 291, 100, 197, 87, 61, 523, 142, 32, 281, 90, 177, 148, 293, 530, 102, 264, 143, 322, 201, 91, 525, 641, 531, 150, 103, 323, 48, 297, 106, 93, 268, 164, 151, 209, 546, 533, 154, 107, 325, 270, 547, 166, 56, 305, 114, 386, 276, 155, 537, 109, 271, 80, 329, 167, 225, 115, 549, 387, 196, 520, 769, 170, 60, 278, 157, 578, 117, 292, 171, 389, 279, 579, 198, 88, 337, 553, 62, 524, 282, 178, 199, 294, 173, 63, 581, 121, 144, 393, 283, 202, 92, 526, 179, 561, 642, 295, 532, 104, 353, 324, 203, 527, 298, 285, 585, 94, 181, 643, 152, 401, 210, 534, 299, 108, 326, 205, 95, 211, 548, 645, 535, 306, 185, 593, 156, 327, 301, 538, 110, 272, 330, 168, 417, 307, 226, 116, 213, 550, 388, 770, 649, 539, 158, 111, 331, 227, 551, 309, 609, 118, 771, 172, 390, 280, 159, 580, 338, 217, 554, 541, 333, 657, 229, 119, 391, 200, 449, 339, 555, 773, 174, 64, 582, 313, 122, 394, 284, 180, 562, 296, 175, 583, 354, 233, 123, 341, 557, 395, 204, 528, 777, 286, 586, 673, 563, 182, 644, 402, 355, 125, 300, 397, 287, 587, 206, 96, 345, 183, 241, 565, 403, 212, 646, 536, 785, 186, 357, 594, 328, 207, 302, 589, 647, 418, 308, 187, 405, 705, 595, 214, 569, 650, 303, 540, 112, 361, 332, 419, 228, 215, 552, 801, 310, 189, 610, 597, 772, 651, 160, 409, 218, 542, 334, 421, 658, 311, 611, 230, 120, 369, 392, 450, 340, 219, 556, 774, 653, 543, 314, 601, 335, 659, 231, 613, 451, 775, 176, 425, 584, 315, 833, 234, 124, 342, 221, 558, 396, 778, 674, 564, 661, 356, 235, 453, 343, 559, 317, 617, 126, 779, 398, 288, 588, 346, 675, 184, 433, 242, 566, 404, 786, 665, 358, 237, 127, 399, 208, 457, 347, 781, 590, 243, 677, 567, 625, 648, 897, 787, 188, 406, 706, 359, 596, 570, 304, 591, 362, 349, 245, 420, 407, 707, 216, 465, 802, 681, 571, 789, 190, 598, 652, 410, 363, 803, 422, 312, 191, 612, 709, 599, 370, 249, 573, 411, 220, 654, 544, 793, 365, 602, 689, 336, 423, 660, 232, 481, 371, 805, 614, 452, 776, 655, 426, 316, 413, 834, 713, 603, 222, 662, 615, 373, 427, 835, 236, 454, 344, 223, 560, 809, 318, 618, 605, 780, 676, 663, 434, 721, 455, 429, 666, 319, 619, 837, 238, 128, 377, 400, 458, 348, 782, 435, 244, 678, 568, 817, 626, 898, 788, 667, 360, 239, 621, 459, 783, 592, 841, 350, 679, 437, 737, 627, 246, 899, 408, 708, 466, 682, 572, 790, 669, 364, 461, 351, 247, 629, 467, 804, 683, 901, 791, 192, 710, 441, 600, 849, 250, 574, 412, 794, 366, 690, 424, 711, 482, 372, 251, 469, 806, 685, 575, 633, 656, 905, 795, 414, 714, 367, 604, 691, 483, 807, 616, 865, 374, 253, 428, 415, 836, 715, 224, 473, 810, 797, 606, 693, 664, 913, 485, 722, 375, 456, 811, 430, 320, 620, 838, 717, 607, 378, 436, 723, 818, 697, 431, 668, 839, 240, 489, 379, 813, 622, 460, 784, 842, 680, 929, 819, 438, 738, 628, 725, 900, 670, 623, 381, 843, 462, 352, 439, 739, 248, 497, 821, 630, 468, 684, 902, 792, 671, 442, 850, 729, 463, 845, 741, 631, 903, 712, 443, 961, 851, 252, 470, 686, 576, 825, 634, 906, 796, 368, 692, 484, 471, 808, 687, 445, 866, 745, 635, 853, 254, 907, 416, 716, 474, 798, 694, 914, 867, 486, 376, 255, 637, 475, 812, 909, 799, 718, 608, 857, 695, 753, 915, 487, 724, 698, 869, 432, 840, 719, 490, 380, 477, 814, 930, 820, 699, 917, 726, 491, 815, 624, 873, 382, 844, 931, 440, 740, 727, 498, 822, 701, 672, 921, 493, 730, 383, 464, 846, 499, 933, 823, 742, 632, 881, 904, 444, 962, 852, 731, 826, 847, 743, 501, 963, 472, 688, 937, 827, 446, 746, 636, 854, 733, 908, 447, 868, 747, 965, 855, 256, 505, 829, 638, 476, 910, 800, 858, 696, 945, 754, 916, 488, 870, 749, 639, 911, 720, 969, 859, 478, 755, 700, 918, 871, 492, 479, 816, 874, 861, 757, 932, 919, 728, 977, 702, 922, 875, 494, 384, 500, 934, 824, 703, 882, 761, 923, 495, 732, 877, 848, 935, 744, 993, 883, 502, 966, 938, 925, 828, 734, 503, 885, 856, 939, 946, 964, 938, 925, 734, 748, 966, 856, 735, 506, 830, 946, 967, 507, 941, 831, 750, 640, 889, 912, 970, 860, 947, 756, 872, 751, 509, 971, 480, 862, 949, 758, 920, 978, 876, 973, 863, 759, 979, 704, 953, 762, 924, 496, 878, 936, 994, 884, 763, 981, 926, 879, 995, 504, 886, 765, 940, 927, 736, 985, 997, 887, 968, 508, 942, 832, 890, 948, 943, 752, 1001, 891, 510, 972, 950, 511, 893, 974, 864, 951, 760, 1009, 980, 954, 975, 955, 764, 982, 880, 996, 983, 957, 766, 928, 986, 998, 888, 767, 987, 999, 944, 1002, 892, 989, 1003, 512, 894, 952, 1010, 1005, 895, 976, 1011, 956, 1013, 984, 958, 959, 768, 1017, 988, 1000, 990, 1004, 991, 1006, 896, 1012, 1007, 1014, 1015, 960, 1018, 1019, 1021, 992, 1008, 1016, 1020, 1022, 1023, 1024].

In a possible design, the first sequence or the second sequence may be a part or all of any one of a sequence (1) to a sequence (20) in this specification.

A smallest value of sequence numbers in any one of the sequence (1) to the sequence (20) in this specification is 1, and the sequence numbers are arranged in descending order of the reliability of the N polar channels.

In a possible design, if the sequence numbers of the N polar channels in the first sequence are arranged in descending order of the reliability of the N polar channels, and a smallest value of the sequence numbers of the N polar channels is 0, 1 is subtracted from each sequence number in any sequence to obtain a new sequence, where sequence performance is not affected.

Similarly, in a possible design, if the sequence numbers of the N polar channels in the first sequence are arranged in ascending order of the reliability of the N polar channels, sequence numbers in any sequence may be arranged in reverse order to obtain a new sequence, where sequence performance is not affected either.

In a possible design, the first sequence may alternatively be represented by using normalized reliability sequences or equivalent reliability sequences of various channels. For example, a sorting location of a channel x in the foregoing sequence is n (where the leftmost location is denoted as 1). In this case, reliability of the channel may be represented as n or normalized n/N, where N is a length of the sequence.

In a possible design, locations of fewer elements in the first sequence may be exchanged. For example, a sequence number location may be adjusted by a specified magnitude, for example, the specified magnitude is 5. A location of an element whose sequence number is 10 may be adjusted by left and right five locations.

According to a second aspect, a polar code encoding apparatus is provided. The apparatus has functions of implementing the method according to the first aspect and any possible design of the first aspect. The functions may be implemented by hardware, or may be implemented by hardware executing corresponding software. The hardware or software includes one or more modules corresponding to the foregoing function.

In a possible design, when some or all of the functions are implemented by using hardware, the polar code encoding apparatus includes: an input interface circuit, configured to obtain to-be-encoded bits, a logical circuit, configured to perform behavior according to the first aspect and any possible design of the first aspect, and an output interface circuit, configured to output an encoded bit sequence.

Optionally, the polar code encoding apparatus may be a chip or an integrated circuit.

In a possible design, when some or all of the functions are implemented by using software, the polar code encoding apparatus includes: a memory, configured to store a program, and a processor, configured to execute the program stored in the memory, where when the program is executed, the polar code encoding apparatus may implement the method according to the first aspect and any possible design of the first aspect.

Optionally, the memory may be a physically independent unit, or may be integrated with the processor.

In a possible design, when some or all of the functions are implemented by using software, the polar code encoding apparatus includes a processor. A memory configured to store a program is located outside of the encoding apparatus, and the processor is connected to the memory by using a circuit/cable, and is configured to read and execute the program stored in the memory.

According to a third aspect, a communications system is provided. The communications system includes a transmit end and a receive end. The transmit end may perform the method according to the first aspect and any possible design of the first aspect.

According to a fourth aspect, a computer storage medium is provided, where the computer storage medium stores a computer program. The computer program includes an instruction used to perform the method according to the first aspect and any possible design of the first aspect.

According to a fifth aspect, an embodiment of this application provides a computer program product including an instruction. When the computer program product is run on a computer, the computer is enabled to perform the method according to the foregoing aspect.

DETAILED DESCRIPTION OF ILLUSTRATIVE EMBODIMENTS

Figure 1:
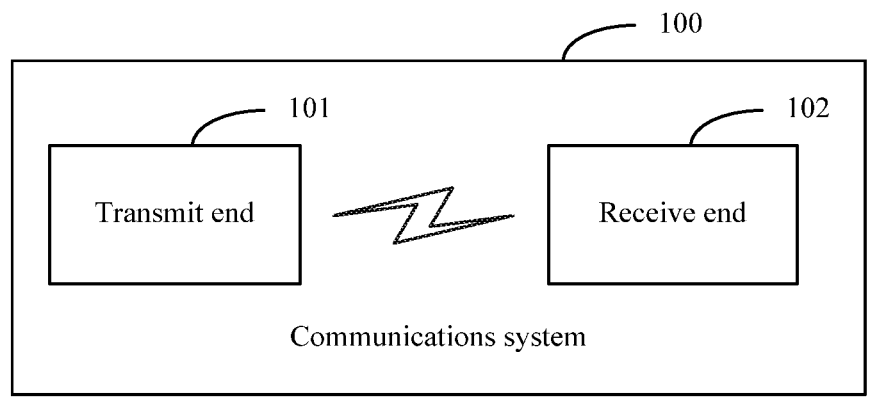
FIG. 1 is a schematic architectural diagram of a communications system to which an embodiment of this application is applied.

The following describes in detail the embodiments of this application with reference to accompanying drawings.

The embodiments of this application provide a polar code encoding method and apparatus. Reliability of a polar channel is determined based on a reliability computation formula, to obtain reliability sorting, sequence numbers for information bits are selected based on the reliability sorting, and polar code encoding is performed based on the selected sequence numbers for the information bits. The reliability computation formula includes a changeable transform kernel (which may be briefly referred to as a kernel). The transform kernel is used to convert a signal from a polar channel sequence number domain to a weight domain of reliability. In the embodiments of this application, because the reliability computation formula including the changeable transform kernel is used, a good identification capability can be realized in both the polar channel sequence number domain and the weight domain of reliability, thereby improving accuracy of reliability sorting of the polar channels, and improving encoding/decoding performance of a polar code.

For convenience of understanding the embodiments of this application, a polar code is briefly described below.

According to an encoding policy of the polar code, a noiseless channel is used to transmit information useful to a user, while a pure noisy channel is used to transmit agreed information or is not used to transmit information. The polar code is also a linear block code. An encoding matrix of the polar code is $G_N$. An encoding process is $x_1^N = u_1^N G_N \cdot u_1^N = (u_1, u_2, \ldots, u_N)$ is a binary row vector, and has a length of N (namely, a code length). $G_N$ is an N×N matrix, and $G_N = F_2^{\otimes(log_2(N))}$, $F_2^{\otimes(log_2(N))}$ is defined as a Kronecker product of $log_2 N$ matrices $F_2$. The foregoing matrix $$F_2 = \begin{bmatrix} 1 & 0 \\ 1 & 1 \end{bmatrix}.$$

In the encoding process of the polar code, some bits in $u_1^N$ are used to carry information and are referred to as information bits, and a set of indexes of these bits is denoted as A. The other bits are set to fixed values that are agreed on by a receive end and a transmit end in advance and are referred to as fixed bits or frozen bits, and a set of indexes of these bits is denoted as $A^c$ that is a complementary set of A. The encoding process of the polar code is equivalent to: $x_1^N = u_A G_N.(A) \oplus u_{A^c} G_N.(A^c)$. Herein, $G_N(A)$ is a submatrix obtained based on rows corresponding to the indexes in the set A in $G_N$, and $G_N(A^c)$ is a submatrix obtained based on rows corresponding to the indexes in the set $A^c$ in $G_N$. $u_A$ is an information bit set in $u_1^N$, and a quantity of information bits is K. $u_A^c$ is a fixed bit set in $u_1^N$, a quantity of fixed bits is (N−K), and the fixed bits are known bits. These fixed bits are usually set to 0. However, the fixed bits may be set to any value provided that the value is agreed on by the receive end and the transmit end in advance. In this way, encoded output of the polar code may be simplified as $x_1^N = u_A G_N(A)$. Herein, $u_A$ is the information bit set in $u_1^N$, and $u_A$ is a row vector having a length of K. In other words, |A|=K, where |·| represents a quantity of elements in a set, K is a size of an information block, $G_N(A)$ is the submatrix obtained based on the rows corresponding to the indexes in the set A in the matrix $G_N$, and $G_N(A)$ is a K×N matrix.

A construction process of the polar code is a process of selecting the set A. This determines performance of the polar code. The construction process of the polar code usually includes: determining, based on a code length N of a mother code, that there are N polar channels in total that respectively correspond to N rows of the encoding matrix, computing reliability of the polar channels, and using indexes of first K polar channels having higher reliability as elements in the set A, and using indexes corresponding to the remaining (N−K) polar channels as elements in the set $A^c$ of the indexes of the fixed bits. A location of the information bit depends on the set A, and a location of the fixed bit depends on the set $A^c$.

The solutions provided in the embodiments of this application relate to how to determine reliability of a polar channel. A basic inventive concept of the embodiments of this application is: The reliability of the polar channel may be indicated by using reliability. From a perspective of signal spectrum analysis, approximation of existing reliability to the reliability of the polar channel may be understood as domain transform of a signal. Similar to Fourier transform in which an $e^{jw}$ kernel is used to implement conversion of a signal between a time domain and a frequency domain, in the method, a β kernel is used to convert a signal from a channel sequence number domain to a weight domain of reliability. In a time-frequency signal analysis field, most commonly, Fourier transform and wavelet transform are included. The Fourier transform is restricted to a form of an kernel of a trigonometric function. Therefore, in a time-frequency signal analysis process based on the Fourier transform, a time-domain identification capability and a frequency-domain identification capability cannot be realized simultaneously. During the wavelet transform, a wavelet transform kernel is used and there are versatile function forms. Therefore, a transient change of a signal in time domain can be captured during domain transform, and a good identification capability can be realized in both time domain and frequency domain. In the embodiments of this application, reliability of a polar channel is estimated by using a changeable transform kernel, thereby improving precision of sequence reliability estimation.

As shown in FIG. 1, a communications system 100 to which an embodiment of this application is applied includes a transmit end 101 and a receive end 102. The transmit end 101 may also be referred to as an encoder, and the receive end 102 may also be referred to as a decoder. The transmit end 101 may be a base station, and the receive end 102 is a terminal. Alternatively, the transmit end 101 is a terminal, and the receive end 102 is a base station. The base station is an apparatus deployed in a radio access network and configured to provide a wireless communication function for the terminal. The base station may include macro base stations, micro base stations, relay stations, access points, and the like in various forms, and may be applied to systems of different radio access technologies, for example, to more possible communications systems such as a long term evolution (LTE) system or a fifth generation (5G) communications system. The base station may further be another network device having a base station function, and particularly, may further be a terminal that serves as the base station function in D2D communication. The terminal may include various handheld devices, in-vehicle devices, wearable devices, or computing devices having a wireless communications function, or another processing device connected to a wireless modem, and various forms of user equipments (UE), mobile stations (MS), and the like.

Based on the architecture of the communications system shown in FIG. 1, in the embodiments of this application, the polar code encoding method may be performed by the transmit end 101. The following describes in detail the polar code encoding method provided in the embodiments of this application.

Figure 2:
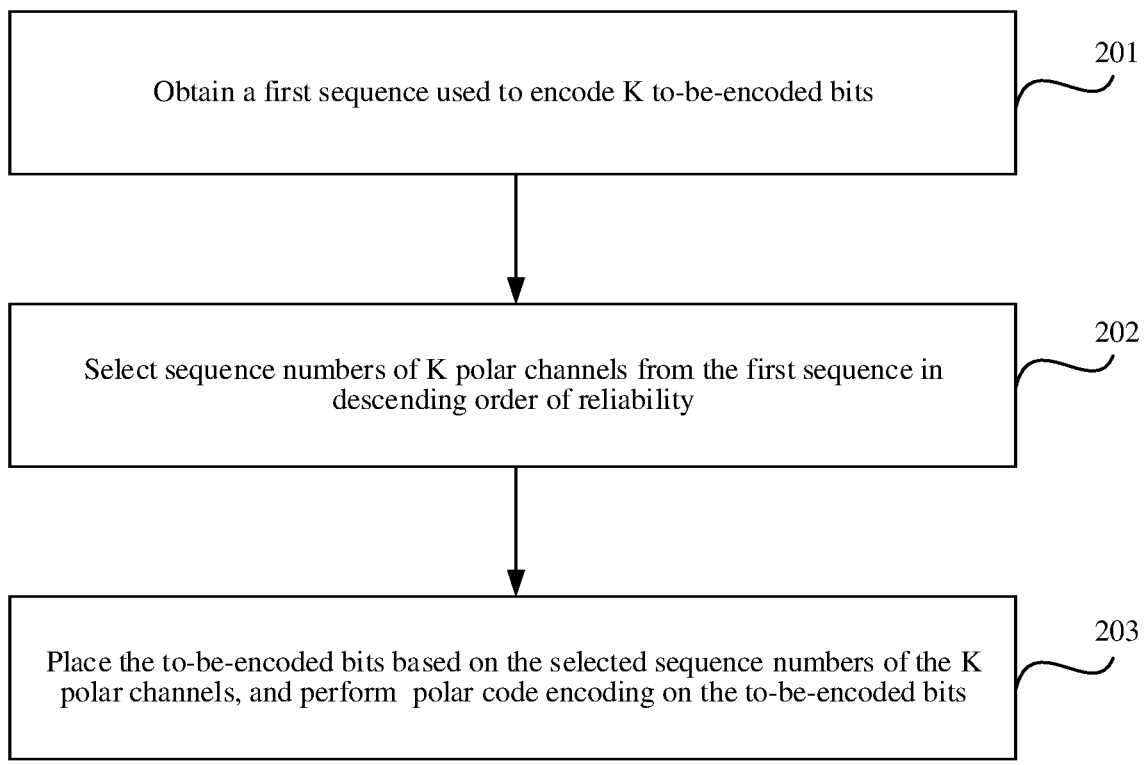
FIG. 2 is a schematic flowchart of a polar code encoding method according to an embodiment of this application.

Based on the architecture of the communications system shown in FIG. 1, as shown in FIG. 2, a specific procedure of a polar code encoding method provided in an embodiment of this application is as follows:

Step 201. Obtain a first sequence used to encode K to-be-encoded bits.

The first sequence includes sequence numbers of N polar channels, and the sequence numbers of the N polar channels are arranged in the first sequence based on reliability of the N polar channels, K is a positive integer, N is a mother code length of a polar code, and N is a positive integer power of 2.

Step 202. Select sequence numbers of K polar channels from the first sequence in descending order of the reliability.

Step 203. Place the to-be-encoded bits based on the selected sequence numbers of the K polar channels, and perform polar code encoding on the to-be-encoded bits.

The K to-be-encoded bits are mapped onto the K polar channels in the N polar channels, where reliability of the K polar channels is higher than reliability of remaining (N−K) polar channels.

Optionally, the first sequence is a second sequence or a subset of a second sequence, the second sequence includes sequence numbers of $N_{max}$ polar channels, and the sequence numbers of the $N_{max}$ polar channels are arranged in the second sequence based on reliability of the $N_{max}$ polar channels, where $N_{max}$ is a positive integer power of 2, and $N_{max} \geq N$. A manner of computing the reliability of the $N_{max}$ polar channels is similar to a manner of computing the reliability of the N polar channels.

Optionally, based on a target code length, rate matching is performed on the sequence obtained after the polar code encoding.

In the encoding method provided in this embodiment, after the input information bits are received, the quantity K of the to-be-encoded bits is determined based on the target code length N of the polar code. Regardless of an online computation manner or a manner of pre-computation plus storage, if the second sequence is known, the first sequence may be obtained from the second sequence. The second sequence includes reliability sorting of the $N_{max}$ polar channels that are a maximum code length supported by the communications system. Optionally, the first sequence may be obtained from the prestored second sequence. Then, the information bits are determined based on the first sequence. Finally, polar encoding is performed on the K to-be-encoded bits, to obtain the bit sequence obtained after the polar encoding. In this way, locations of the information bits and fixed bits are determined by obtaining reliability of a polar channel of a polar code through a semi-online computation and semi-offline storage manner.

The following specifically describes how to determine reliability of an $i^{th}$ polar channel in the N polar channels. The sequence numbers of the N polar channels may be 0 to N−1, or may be 1 to N. In this embodiment of this application, when the reliability of the $i^{th}$ polar channel in the N polar channels is determined, a value of i may be 1, 2, ..., or N, or may be 0, 1 ..., or N−1.

The reliability of the $i^{th}$ polar channel in the N polar channels is represented by $W_i$, and reliability computation formulas may include but are not limited to the following several formulas. It may be understood that, the formulas used in this embodiment of this application are merely examples. A solution obtained by person skilled in the art by simply transforming the formulas without affecting performance of the formulas shall fall within the protection scope of this embodiment of this application.

In the following formulas, without loss of generality, $1 \le i \le N$, $W_i$ is the reliability of the $i^{th}$ polar channel, $n = \log_2 N$, i meets $i-1 = B_{n-1}B_{n-2} \ldots B_1 B_0$, where $B_{n-1}B_{n-2} \ldots B_1 B_0$ is a binary representation of i−1, and $B_j$ is a value of a $j^{th}$ bit in the binary representation of the channel sequence number i, where $B_j \in \{0,1\}$. Such a value taking method depends on that an n-bit binary number can represent only a value from 0 to N−1, and therefore 1 needs to be subtracted from the sequence numbers of the polar channels. Certainly, a value range of the polar channel sequence number i may also be selected as $0 \le i \le N-1$. In this case, $i = B_{n-1}B_{n-2} \ldots B_1 B_0$, that is, $B_{n-1}B_{n-2} \ldots B_1 B_0$ is a binary representation of i−1. Other attributes and a sequence between various polar channels remain unchanged. Therefore, in this application, $1 \le i \le N$ is still used as an example for description.

Computation manner 1:

$$W_i = \sum_{j=0}^{n-1} B_j \times \left( \sum_{\xi \in \Xi} C(\xi, j) \Psi(\xi, j)^{E(\xi)j} \right) \quad (1)$$

In the formula (1), $\Psi(\xi, j)$ is used as a transform kernel, and is briefly referred to as a $\Psi$ kernel. It may alternatively be considered that $\Psi(\xi, j)$ is a kernel function, where the kernel function may also be referred to as a basis function, and a specific form of $\Psi(\xi, j)$ is a function of orders (which may also be referred to as order terms) $\xi$ and j. $\Xi$ is a set of orders constituting the formula (1), where elements included in the set may be natural numbers, integers, rational numbers, or irrational numbers. $C(\xi, j)$ is a function of $\xi$ and j, is a coefficient for a $\xi^{th}$-order $\Psi$ kernel, and represents a weight value of the order term, to be specific, magnitude of contribution of this order of $\Psi$ kernel to final reliability. $E(\xi)$ is a function of $\xi$, and represents a frequency at which this order of $\Psi$ kernel varies with j. $\Psi(\xi, j)$ is a function of $\xi$ and j, and determines a specific representation form of the kernel function or the basis function.

For example, $\Psi(\xi) = a^\xi + b$, where a and b are parameter constants for controlling a kernel form, $$E(\xi) = \frac{d}{f^\xi + g},$$

where d, f, and g are parameter constants for controlling a frequency, and $C(\xi) = c^\xi$.

When a=−0.22, b=1.2, c=0.26, d=1, f=0, g=1, and $\Xi = \{0, 1\}$, the formula (1) may be embodied as a formula (2):

$$W_i = \sum_{j=0}^{n-1} B_j \times (1.2^j + 0.26 \times (0.98)^j) \quad (2)$$

It should be noted that, in this example, $\Psi$, E, and C each include an exponential function relationship with $\xi$. In practice, mathematical function relationships between $\Psi$ and $\xi$, E and $\xi$, and C and $\xi$ are not limited thereto. Details are not described herein due to diversity of mathematical function forms.

Computation manner 2:

The set $\Xi$ is a single-element set, to be specific, $\Xi = 1$ or Size$\Xi = 1$. In this case, the formula (1) may be embodied as a formula (3):

$$W_i = \sum_{j=0}^{n-1} B_j \times (C \times \Psi(j)^{E \times j}) \quad (3)$$

C and E may be constants. In this case, the formula (3) may further be embodied as a formula (4):

$$W_i = \sum_{j=0}^{n-1} B_j \times \Psi(j)^j \quad (4)$$

In the formula (4), a change in a kernel function with binary bits of a sequence number of a polar channel is emphasized.

For meanings of symbols in the formula (3) and the formula (4), refer to descriptions in the formula (1), and details are not described herein again.

Computation manner 3:

The reliability may be represented by using a polarization weight, and a conventional reliability computation manner may be determined by using a polarization weight computation formula. For example, a polarization weight computation formula is $$W_i = \sum_{j=0}^{n-1} B_j \times \beta^j,$$

where β is a transform kernel, and is a constant greater than 1, for example, $\beta = 2^{1/4}$ (where the definition and example are also applicable to the following other computation manners, and therefore are not described herein). In the computation manner 3, the transform kernel uses a β kernel form in a conventional reliability computation manner. The changeable transform kernel is constructed by using different orders of β. A specific computation formula is as a formula (5):

$$W_i = \sum_{j=0}^{n-1} B_j \times \left( \sum_{\xi \in \Xi} C(\xi) \beta^{E(\xi)j} \right) \tag{5}$$

where $C(\xi)$ is a function of $\xi$, is a coefficient for a $\xi^{th}$-order β kernel, and represents a weight value of the order term, to be specific, magnitude of contribution of this order of β kernel to final reliability, and $E(\xi)$ is a function of $\xi$, determines a specific form of each order of β kernel, and represents a frequency at which this order of β kernel varies with j. Others are description symbols and have same meanings as same symbols in the formula (1), and repeated parts are not described again.

Computation manner 4:
In the formula (5), if the function $$E(\xi) = \frac{1}{4\xi},$$

a conventional reliability computation manner includes only a zeroth-order β kernel, for example, $$\beta^{\frac{1}{4^0}} = 2^{1/4}.$$

When a single lower-order kernel is used, the conventional reliability computation manner has a limited identification capability of reliability change during domain transform. Therefore, a higher-order kernel may be introduced to improve reliability estimation precision.

A representation method for introducing the higher-order kernel is shown in a formula (6):

$$W_i = \sum_{j=0}^{n-1} B_j \times \left( \sum_{\xi \in \Xi} C(\xi) \beta^{\frac{1}{4\xi}j} \right) \tag{6}$$

For meanings of symbols in this formula, refer to explanations in the formula (5), and details are not described herein again.

For example, when $\Xi=\{0,1\}$ includes a zeroth-order term and a first-order term, and a coefficient is defined as $$C(\xi) = \frac{1}{4\xi},$$

the formula (6) is embodied as a formula (7):

$$W_i = \sum_{j=0}^{n-1} B_j \times \left( \beta^j + \frac{1}{4} \beta^{\frac{1}{4}j} \right) \tag{7}$$

For another example, when $\Xi=\{0,1,2\}$ includes a zeroth-order term, a first-order term, and a second-order term, and a coefficient is also defined as $$C(\xi) = \frac{1}{4\xi},$$

the formula (6) may be embodied as a formula (8):

$$W_i = \sum_{j=0}^{n-1} B_j \times \left( \beta^j + \frac{1}{4} \beta^{\frac{1}{4}j} + \frac{1}{16} \beta^{\frac{1}{16}j} \right) \tag{8}$$

Computation manner 5:
In the formula (1), some Ψ kernels are β kernels. Specific descriptions are shown in a formula (9):

$$W_i = \sum_{j=0}^{n-1} B_j \times \left( \sum_{\xi \in \Xi_1, \xi \notin \Xi_2} C(\xi) B^{E(\xi)j} + \sum_{\xi \in \Xi_2, \xi \notin \Xi_1} C(\xi) \Psi(\xi, j)^{E(\xi)j} \right) \tag{9}$$

$\Xi_1$ and $\Xi_2$ include orders constituting the formula (9). For a set in which ξ only n belongs to $\Xi_1$, a kernel function of the set is β. For $W_i = \sum_{j=0}^{n-1} B_j \times (\beta^j + a \times b^j)$, for example, when ξ=1, C(1)=1, Ψ(1)=β=$2^{1/4}$=1.1892, E(1)=1, and when ξ=2, C(2)=0.17, Ψ(2)=0.63, E(1)=¼, or E(1)=¼, Ψ(2)=0.8909, E(1)=1.
That is, $$W_i = \sum_{j=0}^{n-1} B_j \times \left( \beta^j + 0.17 \times 0.63^{\frac{1}{4}j} \right), \text{ or} \tag{10}$$

$$W_i = \sum_{j=0}^{n-1} B_j \times (\beta^j + 0.17 \times 0.8909^j). \tag{11}$$

Computation manner 6:

$$W_i = \sum_{j=0}^{n-1} \left( B_j \times (\beta^j + a \times b^j) + \left( \prod_{k \in K} B_k \right) \times B_j \times (\beta^j + c \times d^j) \right) \tag{12}$$

where β is a positive constant, and without loss of generality, let β=$2^{1/4}$, K is a set including binary representation bits of a channel sequence number, to be specific, elements include 0 to n−1, K is a subset of a set {0, 1, ..., n−1}, and a size of the set is 0≤Size(K)≤n−1, if m exists in the set K, sorting of channel sequence numbers from 0 to $2^m-1$ is inconsistent with sorting of channel sequence numbers from $2^m$ to $2^{m+1}-1$ in the sequence, and the elements in the set K changes symmetry characteristics of the sequence, and a and c are respectively weights of kernel functions b and d.

The reliability of the $i^{th}$ polar channel in the N polar channels may be determined by using any one of the foregoing formula (1) to formula (12), to obtain reliability of each polar channel in the N polar channels. A sequence with reliability sorted may be determined in descending order of the reliability, and the sequence may be applied to a polar code encoding process.

This embodiment of this application provides some optional examples of the sequence as follows. In the polar encoding process, the sequence may be obtained by using the foregoing formulas. Alternatively, an obtained sequence may be prestored, and the stored sequence is applied. For example, the sequence may be obtained by looking up a table. A sequence construction design in this application may be unrelated to a channel parameter, and therefore is convenient for offline storage. Using the following sequences can help improve encoding/decoding performance of a polar code. The following sequences may be computed by using the formulas in this embodiment of this application, or may be obtained by using another possible method. This is not limited in this embodiment of this application.

If N=1024:

a sequence obtained by using the formula (2) is a sequence (1) (where sequence numbers start from 1, and in the following provided sequence examples, sequence numbers all start from 1, and details are not described again):

[1, 2, 3, 5, 9, 17, 4, 33, 6, 7, 65, 10, 11, 18, 13, 19, 129, 34, 21, 35, 25, 8, 37, 66, 257, 67, 12, 41, 69, 14, 20, 49, 130, 15, 73, 22, 131, 513, 36, 23, 133, 81, 26, 38, 27, 258, 137, 39, 68, 97, 42, 259, 29, 145, 43, 70, 261, 50, 71, 16, 45, 74, 51, 265, 132, 161, 514, 75, 24, 53, 134, 82, 515, 273, 77, 135, 83, 28, 57, 193, 138, 517, 40, 98, 85, 260, 30, 139, 289, 521, 146, 99, 44, 31, 262, 141, 89, 147, 72, 101, 46, 263, 529, 321, 52, 266, 162, 149, 47, 76, 105, 267, 54, 163, 516, 274, 153, 545, 78, 55, 269, 136, 165, 84, 113, 58, 194, 275, 518, 385, 79, 59, 86, 195, 140, 290, 169, 519, 277, 577, 522, 100, 87, 32, 291, 61, 197, 142, 90, 523, 281, 148, 177, 102, 264, 143, 293, 530, 91, 322, 201, 525, 150, 103, 48, 531, 106, 641, 323, 93, 268, 297, 164, 151, 209, 154, 546, 107, 533, 325, 56, 270, 166, 114, 276, 155, 547, 305, 386, 80, 109, 271, 537, 167, 115, 329, 60, 196, 225, 170, 520, 278, 387, 157, 549, 578, 769, 88, 117, 292, 62, 171, 198, 279, 389, 579, 337, 524, 282, 553, 178, 63, 199, 144, 294, 173, 92, 121, 202, 283, 581, 526, 179, 393, 104, 295, 532, 561, 642, 324, 94, 203, 353, 298, 527, 285, 152, 181, 585, 210, 108, 534, 643, 401, 95, 299, 326, 205, 211, 156, 548, 306, 185, 535, 110, 645, 327, 272, 593, 301, 538, 168, 116, 330, 226, 307, 213, 388, 158, 550, 417, 111, 539, 770, 649, 331, 118, 227, 172, 280, 159, 551, 309, 390, 580, 338, 217, 609, 554, 771, 541, 119, 333, 64, 200, 229, 174, 391, 122, 657, 339, 284, 555, 313, 582, 449, 180, 394, 773, 296, 175, 562, 123, 204, 354, 233, 583, 341, 528, 286, 395, 557, 182, 586, 563, 777, 644, 402, 96, 673, 355, 125, 300, 206, 287, 183, 397, 587, 345, 212, 241, 186, 536, 403, 565, 646, 328, 207, 357, 594, 302, 785, 589, 308, 187, 214, 418, 112, 647, 405, 595, 303, 540, 569, 705, 650, 332, 361, 228, 215, 160, 552, 310, 419, 189, 218, 610, 597, 772, 542, 651, 409, 801, 120, 334, 230, 311, 392, 421, 658, 340, 219, 611, 369, 556, 314, 450, 543, 774, 653, 335, 601, 231, 176, 124, 659, 234, 315, 584, 342, 451, 221, 613, 396, 558, 425, 775, 833, 564, 778, 674, 356, 126, 235, 661, 343, 288, 559, 317, 453, 184, 398, 588, 346, 617, 242, 779, 404, 566, 675, 433, 127, 208, 358, 237, 399, 786, 665, 347, 590, 243, 457, 188, 567, 781, 648, 406, 677, 359, 596, 304, 625, 570, 706, 787, 362, 897, 591, 349, 216, 245, 420, 190, 407, 571, 598, 707, 465, 652, 410, 802, 681, 363, 789, 312, 191, 422, 220, 612, 370, 249, 599, 544, 411, 803, 573, 709, 654, 336, 365, 602, 232, 793, 423, 660, 689, 371, 316, 452, 222, 614, 481, 426, 776, 655, 413, 805, 603, 834, 713, 236, 662, 344, 223, 615, 373, 560, 318, 427, 454, 618, 835, 605, 780, 809, 676, 434, 128, 663, 238, 319, 455, 400, 721, 429, 666, 348, 619, 377, 244, 458, 837, 568, 782, 435, 678, 360, 239, 626, 788, 667, 817, 898, 592, 350, 459, 621, 246, 783, 408, 679, 437, 627, 841, 572, 708, 466, 737, 682, 364, 790, 899, 669, 351, 247, 461, 192, 250, 600, 467, 629, 412, 804, 574, 683, 441, 710, 791, 366, 901, 849, 794, 424, 690, 372, 251, 482, 575, 711, 469, 656, 414, 806, 685, 367, 604, 633, 714, 795, 691, 905, 224, 616, 374, 483, 253, 428, 415, 807, 836, 606, 715, 473, 865, 810, 797, 664, 693, 375, 320, 456, 485, 722, 430, 620, 378, 913, 607, 811, 838, 717, 436, 240, 723, 431, 668, 818, 697, 379, 460, 622, 489, 839, 784, 813, 680, 438, 628, 842, 738, 819, 725, 900, 670, 352, 929, 623, 381, 248, 462, 439, 843, 468, 630, 739, 497, 684, 442, 792, 671, 821, 902, 463, 850, 729, 252, 631, 845, 576, 443, 712, 470, 741, 686, 368, 903, 634, 851, 796, 825, 961, 692, 906, 484, 254, 471, 416, 808, 687, 445, 635, 716, 474, 866, 745, 853, 798, 907, 694, 376, 255, 486, 914, 608, 475, 867, 637, 812, 718, 799, 695, 909, 857, 487, 724, 432, 753, 698, 380, 915, 490, 840, 719, 477, 869, 814, 820, 699, 726, 930, 624, 382, 491, 917, 815, 440, 844, 873, 740, 498, 727, 672, 822, 931, 701, 383, 464, 493, 730, 921, 632, 846, 499, 444, 742, 823, 904, 933, 852, 731, 881, 826, 962, 847, 472, 743, 501, 688, 446, 636, 746, 827, 854, 963, 733, 908, 937, 256, 447, 476, 868, 638, 747, 505, 855, 800, 829, 965, 696, 910, 858, 488, 754, 916, 945, 639, 720, 478, 870, 749, 911, 859, 755, 969, 700, 492, 918, 479, 871, 816, 874, 861, 728, 757, 932, 702, 384, 919, 494, 977, 922, 875, 500, 824, 703, 934, 495, 732, 882, 761, 923, 848, 877, 744, 502, 935, 883, 828, 964, 734, 993, 938, 925, 503, 448, 748, 506, 856, 735, 885, 830, 939, 966, 946, 640, 507, 750, 831, 967, 912, 941, 860, 889, 756, 970, 947, 480, 872, 751, 509, 862, 971, 758, 920, 949, 978, 876, 863, 759, 973, 704, 496, 762, 979, 924, 953, 878, 936, 884, 763, 994, 981, 926, 879, 504, 736, 886, 995, 765, 940, 927, 985, 508, 887, 832, 968, 997, 942, 890, 948, 752, 510, 943, 891, 972, 1001, 950, 511, 864, 893, 760, 974, 951, 980, 1009, 954, 975, 764, 955, 982, 880, 996, 766, 983, 928, 957, 986, 888, 767, 998, 987, 999, 944, 892, 1002, 989, 512, 894, 1003, 952, 1010, 895, 976, 1005, 1011, 956, 984, 1013, 958, 768, 959, 988, 1017, 1000, 990, 1004, 991, 896, 1006, 1012, 1007, 1014, 1015, 960, 1018, 1019, 992, 1021, 1008, 1016, 1020, 1022, 1023, 1024], a sequence obtained by using the formula (7) is a sequence (2):

[1, 2, 3, 5, 9, 17, 33, 4, 6, 7, 65, 10, 11, 18, 13, 129, 19, 34, 21, 35, 25, 257, 37, 8, 66, 67, 41, 12, 69, 14, 130, 49, 20, 15, 73, 513, 131, 22, 133, 36, 23, 81, 26, 258, 38, 137, 27, 259, 39, 97, 68, 42, 29, 145, 261, 70, 43, 50, 71, 265, 45, 16, 74, 514, 161, 132, 51, 75, 515, 134, 273, 53, 24, 82, 77, 517, 135, 193, 83, 138, 57, 28, 289, 260, 40, 98, 521, 139, 85, 30, 146, 262, 99, 141, 44, 31, 89, 529, 147, 263, 321, 101, 72, 266, 46, 162, 149, 52, 267, 47, 105, 545, 76, 516, 163, 274, 54, 153, 269, 385, 78, 518, 165, 136, 275, 194, 55, 113, 84, 58, 79, 519, 577, 290, 195, 277, 522, 169, 140, 86, 59, 291, 197, 100, 523, 87, 142, 281, 61, 32, 90, 530, 177, 148, 293, 264, 322, 102, 525, 143, 201, 641, 91, 531, 150, 323, 103, 297, 268, 48, 106, 546, 164, 93, 533, 151, 209, 325, 154, 270, 107, 547, 386, 166, 305, 276, 56, 114, 537, 155, 271, 329, 769, 109, 549, 387, 80, 520, 167, 578, 225, 196, 278, 115, 170, 157, 60, 579, 389, 292, 553, 279, 198, 524, 337, 171, 117, 88, 282, 62, 178, 581, 294, 199, 393, 526, 173, 144, 283, 202, 642, 63, 121, 561, 92, 532, 179, 295, 353, 324, 104, 527, 585, 298, 203, 643, 285, 401, 94, 534, 181, 152, 210, 326, 299, 205, 108, 645, 548, 95, 535, 593, 306, 211, 538, 327, 185, 156, 301, 272, 330, 770, 417, 110, 550, 388, 168, 307, 226, 649, 213, 116, 539, 158, 331, 771, 111, 551, 609, 580, 390, 227, 309, 554, 280, 338, 172, 118, 541, 159, 217, 657, 333, 773, 391, 449, 582, 229, 555, 200, 339, 394, 119, 174, 313, 284, 64, 122, 562, 180, 583, 296, 354, 777, 557, 395, 528, 341, 175, 586, 233, 673, 204, 644, 286, 123, 563, 402, 182, 355, 587, 397, 300, 287, 206, 646, 345, 785, 125, 565, 403, 96, 536, 183, 594, 241, 212, 357, 328, 186, 589, 302, 207, 647, 705, 418, 595, 405, 308, 650, 569, 214, 540, 187, 303, 361, 801, 332, 772, 419, 112, 552, 610, 228, 651, 597, 310, 215, 409, 542, 189, 160, 218, 658, 334, 774, 611, 421, 392, 450, 311, 230, 653, 556, 369, 340, 120, 543, 601, 314, 219, 659, 335, 775, 833, 613, 451, 584, 231, 778, 425, 558, 396, 342, 176, 315, 234, 674, 221, 124, 661, 564, 453, 356, 779, 559, 617, 343, 588, 398, 235, 675, 317, 288, 346, 786, 433, 126, 566, 404, 184, 242, 665, 358, 781, 399, 457, 897, 590, 237, 677, 208, 648, 347, 787, 706, 127, 567, 625, 596, 406, 243, 570, 359, 188, 591, 304, 362, 802, 707, 420, 349, 789, 681, 407, 652, 465, 598, 245, 571, 216, 410, 190, 363, 803, 709, 612, 422, 599, 312, 654, 370, 793, 573, 411, 544, 191, 602, 249, 689, 220, 660, 365, 805, 336, 776, 423, 834, 481, 614, 452, 232, 655, 371, 713, 426, 603, 413, 316, 222, 662, 835, 615, 809, 454, 780, 427, 560, 373, 618, 344, 236, 676, 605, 318, 223, 663, 721, 434, 837, 666, 455, 782, 619, 429, 400, 458, 898, 319, 238, 678, 377, 817, 348, 788, 435, 128, 568, 626, 244, 667, 360, 783, 841, 621, 459, 899, 592, 239, 679, 737, 708, 350, 790, 627, 437, 682, 408, 466, 246, 669, 572, 461, 364, 901, 804, 351, 791, 710, 849, 683, 629, 467, 600, 247, 794, 441, 574, 412, 192, 250, 690, 366, 806, 711, 424, 482, 905, 685, 656, 469, 372, 795, 714, 575, 633, 604, 414, 251, 691, 367, 807, 865, 836, 483, 616, 810, 715, 428, 374, 797, 415, 473, 913, 606, 253, 693, 224, 664, 722, 838, 485, 811, 456, 375, 717, 620, 430, 607, 320, 378, 818, 723, 436, 839, 697, 668, 813, 784, 431, 842, 489, 929, 622, 460, 900, 240, 680, 379, 819, 738, 725, 628, 438, 670, 843, 623, 462, 902, 739, 381, 821, 352, 792, 439, 850, 684, 497, 630, 468, 248, 671, 729, 442, 845, 463, 903, 961, 741, 712, 851, 906, 631, 686, 825, 470, 796, 443, 576, 634, 252, 692, 368, 808, 866, 484, 907, 853, 687, 745, 471, 716, 798, 635, 445, 416, 474, 914, 254, 694, 867, 486, 909, 812, 376, 799, 718, 857, 637, 475, 915, 608, 255, 695, 753, 724, 869, 840, 698, 487, 814, 719, 432, 490, 930, 477, 380, 917, 820, 726, 699, 815, 873, 844, 491, 931, 624, 740, 382, 822, 727, 440, 498, 921, 701, 672, 730, 846, 493, 933, 464, 904, 962, 383, 823, 742, 881, 852, 499, 632, 826, 731, 444, 847, 963, 743, 937, 908, 854, 688, 501, 827, 746, 472, 733, 636, 446, 965, 868, 855, 910, 747, 829, 800, 447, 858, 505, 945, 638, 476, 916, 256, 696, 754, 870, 488, 911, 969, 749, 720, 859, 639, 478, 918, 755, 871, 700, 816, 874, 492, 932, 861, 479, 919, 977, 757, 728, 922, 702, 875, 494, 934, 384, 824, 882, 500, 923, 703, 761, 732, 877, 848, 495, 935, 993, 964, 744, 883, 938, 502, 925, 828, 734, 966, 939, 885, 856, 503, 748, 830, 735, 448, 506, 946, 967, 941, 912, 970, 831, 750, 889, 860, 507, 947, 640, 756, 872, 971, 751, 862, 509, 949, 480, 920, 978, 758, 973, 876, 863, 979, 759, 953, 924, 704, 762, 878, 496, 936, 994, 981, 884, 926, 763, 879, 995, 940, 886, 504, 927, 985, 765, 736, 997, 968, 887, 942, 832, 890, 508, 948, 943, 1001, 972, 752, 891, 510, 950, 974, 893, 864, 511, 951, 1009, 980, 760, 954, 975, 982, 955, 764, 880, 996, 983, 957, 928, 986, 766, 998, 888, 987, 767, 999, 944, 1002, 989, 892, 1003, 894, 512, 952, 1010, 1005, 976, 895, 1011, 956, 1013, 984, 958, 959, 1017, 988, 768, 1000, 990, 1004, 991, 1006, 896, 1012, 1007, 1014, 1015, 960, 1018, 1019, 1021, 992, 1008, 1016, 1020, 1022, 1023, 1024], a sequence obtained by using the formula (8) is a sequence (3):

[1, 2, 3, 5, 9, 17, 33, 4, 6, 65, 7, 10, 11, 18, 129, 13, 19, 34, 21, 35, 25, 257, 37, 66, 8, 67, 41, 12, 69, 130, 14, 49, 20, 513, 73, 131, 15, 22, 133, 36, 81, 23, 26, 258, 137, 38, 27, 259, 97, 39, 68, 42, 145, 29, 261, 70, 43, 50, 265, 71, 514, 161, 45, 74, 132, 16, 51, 515, 75, 273, 134, 53, 82, 24, 517, 193, 77, 135, 83, 138, 57, 289, 28, 521, 260, 98, 139, 40, 85, 146, 30, 262, 99, 141, 529, 44, 89, 321, 147, 31, 263, 101, 266, 72, 162, 46, 149, 52, 545, 267, 105, 516, 163, 47, 76, 274, 153, 54, 385, 269, 518, 165, 275, 194, 78, 113, 136, 55, 84, 577, 519, 58, 290, 195, 79, 277, 522, 169, 140, 86, 59, 291, 523, 197, 100, 281, 87, 142, 530, 177, 61, 90, 293, 322, 148, 641, 32, 525, 264, 201, 102, 143, 531, 91, 323, 150, 297, 103, 546, 268, 533, 106, 164, 209, 48, 93, 325, 151, 547, 154, 386, 270, 107, 305, 166, 537, 276, 769, 114, 329, 155, 56, 549, 387, 271, 578, 225, 109, 520, 167, 196, 80, 278, 115, 170, 157, 579, 389, 60, 553, 292, 337, 279, 524, 198, 171, 117, 282, 88, 581, 178, 62, 393, 294, 199, 642, 526, 173, 561, 283, 202, 121, 144, 532, 353, 179, 63, 92, 295, 585, 324, 643, 527, 298, 203, 104, 401, 285, 534, 181, 210, 94, 326, 152, 645, 299, 205, 548, 593, 535, 108, 306, 211, 95, 538, 327, 185, 770, 417, 301, 330, 156, 649, 550, 388, 272, 307, 226, 110, 168, 539, 213, 771, 116, 609, 331, 551, 158, 580, 390, 227, 111, 309, 554, 338, 657, 541, 280, 773, 172, 217, 118, 449, 333, 159, 391, 582, 555, 229, 339, 394, 200, 313, 119, 174, 562, 284, 777, 583, 122, 354, 180, 673, 64, 557, 395, 296, 341, 586, 233, 644, 528, 175, 563, 204, 402, 286, 123, 355, 182, 587, 397, 785, 646, 300, 345, 565, 403, 287, 206, 594, 241, 125, 536, 357, 183, 212, 705, 96, 589, 328, 647, 186, 418, 302, 207, 595, 405, 650, 569, 308, 801, 540, 214, 361, 187, 772, 419, 303, 610, 332, 651, 552, 597, 228, 112, 409, 310, 215, 658, 542, 189, 774, 611, 218, 421, 450, 334, 160, 653, 369, 392, 311, 556, 230, 601, 340, 833, 659, 543, 775, 314, 219, 120, 613, 451, 335, 778, 425, 584, 231, 674, 558, 396, 342, 661, 315, 234, 176, 221, 564, 779, 453, 124, 617, 356, 675, 559, 343, 588, 398, 235, 786, 433, 317, 346, 665, 566, 404, 897, 288, 781, 242, 126, 457, 358, 184, 677, 399, 787, 706, 590, 237, 625, 648, 347, 567, 208, 596, 406, 243, 127, 570, 359, 802, 707, 591, 789, 362, 188, 681, 420, 465, 304, 349, 407, 652, 598, 571, 245, 803, 410, 216, 709, 363, 190, 612, 422, 793, 599, 654, 370, 689, 573, 411, 312, 602, 805, 249, 834, 660, 544, 481, 365, 191, 776, 220, 423, 713, 614, 452, 336, 655, 371, 426, 232, 603, 413, 835, 662, 316, 809, 615, 222, 780, 454, 427, 373, 618, 676, 721, 560, 605, 344, 837, 663, 236, 434, 318, 223, 666, 455, 898, 782, 619, 429, 817, 458, 678, 377, 400, 788, 435, 319, 238, 626, 348, 841, 667, 568, 899, 783, 244, 737, 128, 621, 459, 360, 679, 708, 592, 239, 790, 627, 437, 682, 466, 350, 669, 408, 901, 572, 246, 461, 804, 849, 791, 710, 364, 683, 629, 467, 351, 794, 441, 600, 247, 690, 574, 412, 905, 806, 711, 250, 482, 366, 192, 685, 424, 795, 469, 714, 633, 656, 372, 865, 691, 575, 604, 807, 414, 251, 836, 483, 367, 810, 715, 616, 913, 797, 428, 473, 374, 693, 415, 722, 606, 253, 838, 664, 811, 485, 224, 717, 456, 375, 620, 430, 818, 723, 607, 839, 378, 697, 436, 929, 320, 813, 842, 668, 489, 900, 784, 431, 819, 738, 622, 460, 680, 725, 379, 240, 628, 438, 843, 670, 902, 739, 623, 821, 462, 850, 497, 381, 792, 439, 684, 729, 630, 468, 961, 352, 845, 671, 903, 442, 248, 741, 463, 851, 906, 712, 825, 631, 686, 796, 470, 443, 634, 866, 692, 576, 907, 808, 853, 252, 745, 484, 368, 687, 471, 716, 914, 798, 635, 445, 867, 474, 694, 416, 909, 254, 812, 486, 857, 915, 799, 718, 753, 637, 475, 376, 869, 695, 724, 608, 255, 840, 698, 487, 930, 814, 719, 917, 490, 432, 477, 820, 726, 380, 873, 699, 931, 815, 844, 491, 740, 624, 921, 822, 727, 498, 382, 701, 440, 730, 933, 962, 846, 672, 493, 881, 904, 823, 742, 464, 852, 499, 383, 826, 731, 632, 963, 847, 444, 937, 743, 908, 854, 827, 501, 746, 688, 733, 472, 965, 636, 446, 868, 855, 910, 747, 945, 829, 858, 505, 916, 800, 447, 754, 638, 476, 969, 870, 696, 911, 256, 749, 488, 859, 720, 918, 755, 639, 871, 478, 874, 700, 932, 977, 816, 861, 919, 492, 757, 479, 922, 728, 875, 702, 934, 494, 882, 923, 824, 761, 500, 993, 384, 877, 703, 732, 935, 964, 848, 495, 883, 938, 744, 925, 828, 502, 734, 966, 939, 885, 856, 503, 748, 946, 830, 735, 967, 506, 448, 941, 970, 889, 912, 947, 831, 750, 860, 507, 756, 640, 971, 872, 751, 949, 978, 862, 509, 920, 758, 480, 973, 876, 979, 863, 953, 759, 924, 762, 994, 878, 704, 936, 981, 496, 884, 926, 763, 995, 879, 940, 985, 886, 927, 765, 504, 997, 736, 968, 887, 942, 890, 948, 832, 508, 1001, 943, 972, 891, 752, 950, 510, 974, 1009, 893, 951, 980, 864, 511, 954, 760, 975, 982, 955, 764, 996, 880, 983, 957, 986, 928, 766, 998, 987, 888, 767, 999, 1002, 944, 989, 892, 1003, 1010, 894, 952, 512, 1005, 976, 1011, 895, 956, 1013, 984, 958, 1017, 959, 988, 768, 1000, 990, 1004, 991, 1006, 1012, 896, 1007, 1014, 1015, 1018, 960, 1019, 1021, 992, 1008, 1016, 1020, 1022, 1023, 1024], and a sequence obtained by using the formula (10) or (11) is a sequence (4):

[1, 2, 3, 5, 9, 17, 33, 4, 6, 7, 65, 10, 11, 18, 13, 129, 19, 34, 21, 35, 25, 37, 8, 257, 66, 67, 41, 12, 69, 14, 49, 130, 20, 15, 73, 131, 513, 22, 36, 133, 23, 81, 26, 38, 258, 137, 27, 39, 97, 259, 68, 42, 29, 145, 43, 261, 70, 50, 71, 45, 16, 265, 74, 161, 51, 132, 514, 75, 53, 515, 134, 24, 273, 82, 77, 135, 193, 83, 517, 57, 138, 28, 40, 289, 98, 85, 260, 139, 521, 30, 146, 99, 44, 262, 141, 31, 89, 147, 529, 101, 263, 72, 321, 46, 266, 162, 52, 149, 47, 105, 267, 76, 163, 545, 54, 516, 274, 153, 269, 78, 165, 55, 113, 136, 385, 275, 194, 84, 518, 58, 79, 195, 519, 290, 169, 59, 277, 577, 86, 140, 522, 291, 100, 197, 87, 61, 523, 142, 32, 281, 90, 177, 148, 293, 530, 102, 264, 143, 322, 201, 91, 525, 641, 531, 150, 103, 323, 48, 297, 106, 93, 268, 164, 151, 209, 546, 533, 154, 107, 325, 270, 547, 166, 56, 305, 114, 386, 276, 155, 537, 109, 271, 80, 329, 167, 225, 115, 549, 387, 196, 520, 769, 170, 60, 278, 157, 578, 117, 292, 171, 389, 279, 579, 198, 88, 337, 553, 62, 524, 282, 178, 199, 294, 173, 63, 581, 121, 144, 393, 283, 202, 92, 526, 179, 561, 642, 295, 532, 104, 353, 324, 203, 527, 298, 285, 585, 94, 181, 643, 152, 401, 210, 534, 299, 108, 326, 205, 95, 211, 548, 645, 535, 306, 185, 593, 156, 327, 301, 538, 110, 272, 330, 168, 417, 307, 226, 116, 213, 550, 388, 770, 649, 539, 158, 111, 331, 227, 551, 309, 609, 118, 771, 172, 390, 280, 159, 580, 338, 217, 554, 541, 333, 657, 229, 119, 391, 200, 449, 339, 555, 773, 174, 64, 582, 313, 122, 394, 284, 180, 562, 296, 175, 583, 354, 233, 123, 341, 557, 395, 204, 528, 777, 286, 586, 673, 563, 182, 644, 402, 355, 125, 300, 397, 287, 587, 206, 96, 345, 183, 241, 565, 403, 212, 646, 536, 785, 186, 357, 594, 328, 207, 302, 589, 647, 418, 308, 187, 405, 705, 595, 214, 569, 650, 303, 540, 112, 361, 332, 419, 228, 215, 552, 801, 310, 189, 610, 597, 772, 651, 160, 409, 218, 542, 334, 421, 658, 311, 611, 230, 120, 369, 392, 450, 340, 219, 556, 774, 653, 543, 314, 601, 335, 659, 231, 613, 451, 775, 176, 425, 584, 315, 833, 234, 124, 342, 221, 558, 396, 778, 674, 564, 661, 356, 235, 453, 343, 559, 317, 617, 126, 779, 398, 288, 588, 346, 675, 184, 433, 242, 566, 404, 786, 665, 358, 237, 127, 399, 208, 457, 347, 781, 590, 243, 677, 567, 625, 648, 897, 787, 188, 406, 706, 359, 596, 570, 304, 591, 362, 349, 245, 420, 407, 707, 216, 465, 802, 681, 571, 789, 190, 598, 652, 410, 363, 803, 422, 312, 191, 612, 709, 599, 370, 249, 573, 411, 220, 654, 544, 793, 365, 602, 689, 336, 423, 660, 232, 481, 371, 805, 614, 452, 776, 655, 426, 316, 413, 834, 713, 603, 222, 662, 615, 373, 427, 835, 236, 454, 344, 223, 560, 809, 318, 618, 605, 780, 676, 663, 434, 721, 455, 429, 666, 319, 619, 837, 238, 128, 377, 400, 458, 348, 782, 435, 244, 678, 568, 817, 626, 898, 788, 667, 360, 239, 621, 459, 783, 592, 841, 350, 679, 437, 737, 627, 246, 899, 408, 708, 466, 682, 572, 790, 669, 364, 461, 351, 247, 629, 467, 804, 683, 901, 791, 192, 710, 441, 600, 849, 250, 574, 412, 794, 366, 690, 424, 711, 482, 372, 251, 469, 806, 685, 575, 633, 656, 905, 795, 414, 714, 367, 604, 691, 483, 807, 616, 865, 374, 253, 428, 415, 836, 715, 224, 473, 810, 797, 606, 693, 664, 913, 485, 722, 375, 456, 811, 430, 320, 620, 838, 717, 607, 378, 436, 723, 818, 697, 431, 668, 839, 240, 489, 379, 813, 622, 460, 784, 842, 680, 929, 819, 438, 738, 628, 725, 900, 670, 623, 381, 843, 462, 352, 439, 739, 248, 497, 821, 630, 468, 684, 902, 792, 671, 442, 850, 729, 463, 845, 741, 631, 903, 712, 443, 961, 851, 252, 470, 686, 576, 825, 634, 906, 796, 368, 692, 484, 471, 808, 687, 445, 866, 745, 635, 853, 254, 907, 416, 716, 474, 798, 694, 914, 867, 486, 376, 255, 637, 475, 812, 909, 799, 718, 608, 857, 695, 753, 915, 487, 724, 698, 869, 432, 840, 719, 490, 380, 477, 814, 930, 820, 699, 917, 726, 491, 815, 624, 873, 382, 844, 931, 440, 740, 727, 498, 822, 701, 672, 921, 493, 730, 383, 464, 846, 499, 933, 823, 742, 632, 881, 904, 444, 962, 852, 731, 826, 847, 743, 501, 963, 472, 688, 937, 827, 446, 746, 636, 854, 733, 908, 447, 868, 747, 965, 855, 256, 505, 829, 638, 476, 910, 800, 858, 696, 945, 754, 916, 488, 870, 749, 639, 911, 720, 969, 859, 478, 755, 700, 918, 871, 492, 479, 816, 874, 861, 757, 932, 919, 728, 977, 702, 922, 875, 494, 384, 500, 934, 824, 703, 882, 761, 923, 495, 732, 877, 848, 935, 744, 993, 883, 502, 964, 938, 828, 925, 734, 503, 885, 939, 448, 748, 966, 856, 735, 506, 830, 946, 967, 507, 941, 831, 750, 640, 889, 912, 970, 860, 947, 756, 872, 751, 509, 971, 480, 862, 949, 758, 920, 978, 876, 973, 863, 759, 979, 704, 953, 762, 924, 496, 878, 936, 994, 884, 763, 981, 926, 879, 995, 504, 886, 765, 940, 927, 736, 985, 997, 887, 968, 508, 942, 832, 890, 948, 943, 752, 1001, 891, 510, 972, 950, 511, 893, 974, 864, 951, 760, 1009, 980, 954, 975, 955, 764, 982, 880, 996, 983, 957, 766, 928, 986, 998, 888, 767, 987, 999, 944, 1002, 892, 989, 1003, 512, 894, 952, 1010, 1005, 895, 976, 1011, 956, 1013, 984, 958, 959, 768, 1017, 988, 1000, 990, 1004, 991, 1006, 896, 1012, 1007, 1014, 1015, 960, 1018, 1019, 1021, 992, 1008, 1016, 1020, 1022, 1023, 1024].

If N=512:
a sequence obtained by using the formula (2) is a sequence (5):

[1, 2, 3, 5, 9, 17, 4, 33, 6, 7, 65, 10, 11, 18, 13, 19, 129, 34, 21, 35, 25, 8, 37, 66, 257, 67, 12, 41, 69, 14, 20, 49, 130, 15, 73, 22, 131, 36, 23, 133, 81, 26, 38, 27, 258, 137, 39, 68, 97, 42, 259, 29, 145, 43, 70, 261, 50, 71, 16, 45, 74, 51, 265, 132, 161, 75, 24, 53, 134, 82, 273, 77, 135, 83, 28, 57, 193, 138, 40, 98, 85, 260, 30, 139, 289, 146, 99, 44, 31, 262, 141, 89, 147, 72, 101, 46, 263, 321, 52, 266, 162, 149, 47, 76, 105, 267, 54, 163, 274, 153, 78, 55, 269, 136, 165, 84, 113, 58, 194, 275, 385, 79, 59, 86, 195, 140, 290, 169, 277, 100, 87, 32, 291, 61, 197, 142, 90, 281, 148, 177, 102, 264, 143, 293, 91, 322, 201, 150, 103, 48, 106, 323, 93, 268, 297, 164, 151, 209, 154, 107, 325, 56, 270, 166, 114, 276, 155, 305, 386, 80, 109, 271, 167, 115, 329, 60, 196, 225, 170, 278, 387, 157, 88, 117, 292, 62, 171, 198, 279, 389, 337, 282, 178, 63, 199, 144, 294, 173, 92, 121, 202, 283, 179, 393, 104, 295, 324, 94, 203, 353, 298, 285, 152, 181, 210, 108, 401, 95, 299, 326, 205, 211, 156, 306, 185, 110, 327, 272, 301, 168, 116, 330, 226, 307, 213, 388, 158, 417, 111, 331, 118, 227, 172, 280, 159, 309, 390, 338, 217, 119, 333, 64, 200, 229, 174, 391, 122, 339, 284, 313, 449, 180, 394, 296, 175, 123, 204, 354, 233, 341, 286, 395, 182, 402, 96, 355, 125, 300, 206, 287, 183, 397, 345, 212, 241, 186, 403, 328, 207, 357, 302, 308, 187, 214, 418, 112, 405, 303, 332, 361, 228, 215, 160, 310, 419, 189, 218, 409, 120, 334, 230, 311, 392, 421, 340, 219, 369, 314, 450, 335, 231, 176, 124, 234, 315, 342, 451, 221, 396, 425, 356, 126, 235, 343, 288, 317, 453, 184, 398, 346, 242, 404, 433, 127, 208, 358, 237, 399, 347, 243, 457, 188, 406, 359, 304, 362, 349, 216, 245, 420, 190, 407, 465, 410, 363, 312, 191, 422, 220, 370, 249, 411, 336, 365, 232, 423, 371, 316, 452, 222, 481, 426, 413, 236, 344, 223, 373, 318, 427, 454, 434, 128, 238, 319, 455, 400, 429, 348, 377, 244, 458, 435, 360, 239, 350, 459, 246, 408, 437, 466, 364, 351, 247, 461, 192, 250, 467, 412, 441, 366, 424, 372, 251, 482, 469, 414, 367, 224, 374, 483, 253, 428, 415, 473, 375, 320, 456, 485, 430, 378, 436, 240, 431, 379, 460, 489, 438, 352, 381, 248, 462, 439, 468, 497, 442, 463, 252, 443, 470, 368, 484, 254, 471, 416, 445, 474, 376, 255, 486, 475, 487, 432, 380, 490, 477, 382, 491, 440, 498, 383, 464, 493, 499, 444, 472, 501, 446, 256, 447, 476, 505, 488, 478, 492, 479, 384, 494, 500, 495, 502, 503, 448, 506, 507, 480, 509, 496, 504, 508, 510, 511, 512], a sequence obtained by using the formula (7) is a sequence (6):

[1, 2, 3, 5, 9, 17, 33, 4, 6, 7, 65, 10, 11, 18, 13, 129, 19, 34, 21, 35, 25, 257, 37, 8, 66, 67, 41, 12, 69, 14, 130, 49, 20, 15, 73, 131, 22, 133, 36, 23, 81, 26, 258, 38, 137, 27, 259, 39, 97, 68, 42, 29, 145, 261, 70, 43, 50, 71, 265, 45, 16, 74, 161, 132, 51, 75, 134, 273, 53, 24, 82, 77, 135, 193, 83, 138, 57, 28, 289, 260, 40, 98, 139, 85, 30, 146, 262, 99, 141, 44, 31, 89, 147, 263, 321, 101, 72, 266, 46, 162, 149, 52, 267, 47, 105, 76, 163, 274, 54, 153, 269, 385, 78, 165, 136, 275, 194, 55, 113, 84, 58, 79, 290, 195, 277, 169, 140, 86, 59, 291, 197, 100, 87, 142, 281, 61, 32, 90, 177, 148, 293, 264, 322, 102, 143, 201, 91, 150, 323, 103, 297, 268, 48, 106, 164, 93, 151, 209, 325, 154, 270, 107, 386, 166, 305, 276, 56, 114, 155, 271, 329, 109, 387, 80, 167, 225, 196, 278, 115, 170, 157, 60, 389, 292, 279, 198, 337, 171, 117, 88, 282, 62, 178, 294, 199, 393, 173, 144, 283, 202, 63, 121, 92, 179, 295, 353, 324, 104, 298, 203, 285, 401, 94, 181, 152, 210, 326, 299, 205, 108, 95, 306, 211, 327, 185, 156, 301, 272, 330, 417, 110, 388, 168, 307, 226, 213, 116, 158, 331, 111, 390, 227, 309, 280, 338, 172, 118, 159, 217, 333, 391, 449, 229, 200, 339, 394, 119, 174, 313, 284, 64, 122, 180, 296, 354, 395, 341, 175, 233, 204, 286, 123, 402, 182, 355, 397, 300, 287, 206, 345, 125, 403, 96, 183, 241, 212, 357, 328, 186, 302, 207, 418, 405, 308, 214, 187, 303, 361, 332, 419, 112, 228, 310, 215, 409, 189, 160, 218, 334, 421, 392, 450, 311, 230, 369, 340, 120, 314, 219, 335, 451, 231, 425, 396, 342, 176, 315, 234, 221, 124, 453, 356, 343, 398, 235, 317, 288, 346, 433, 126, 404, 184, 242, 358, 399, 457, 237, 208, 347, 127, 406, 243, 359, 188, 304, 362, 420, 349, 407, 465, 245, 216, 410, 190, 363, 422, 312, 370, 411, 191, 249, 220, 365, 336, 423, 481, 452, 232, 371, 426, 413, 316, 222, 454, 427, 373, 344, 236, 318, 223, 434, 455, 429, 400, 458, 319, 238, 377, 348, 435, 128, 244, 360, 459, 239, 350, 437, 408, 466, 246, 461, 364, 351, 467, 247, 441, 412, 192, 250, 366, 424, 482, 469, 372, 414, 251, 367, 483, 428, 374, 415, 473, 253, 224, 485, 456, 375, 430, 320, 378, 436, 431, 489, 460, 240, 379, 438, 462, 381, 352, 439, 497, 468, 248, 442, 463, 470, 443, 252, 368, 484, 471, 445, 416, 474, 254, 486, 376, 475, 255, 487, 432, 490, 477, 380, 491, 382, 440, 498, 493, 464, 383, 499, 444, 501, 472, 446, 447, 505, 476, 256, 488, 478, 492, 479, 494, 384, 500, 495, 502, 503, 448, 506, 507, 509, 480, 496, 504, 508, 510, 511, 512], a sequence obtained by using the formula (8) is a sequence (7):

[1, 2, 3, 5, 9, 17, 33, 4, 6, 65, 7, 10, 11, 18, 129, 13, 19, 34, 21, 35, 25, 257, 37, 66, 8, 67, 41, 12, 69, 130, 14, 49, 20, 73, 131, 15, 22, 133, 36, 81, 23, 26, 258, 137, 38, 27, 259, 97, 39, 68, 42, 145, 29, 261, 70, 43, 50, 265, 71, 161, 45, 74, 132, 16, 51, 75, 273, 134, 53, 82, 24, 193, 77, 135, 83, 138, 57, 289, 28, 260, 98, 139, 40, 85, 146, 30, 262, 99, 141, 44, 89, 321, 147, 31, 263, 101, 266, 72, 162, 46, 149, 52, 267, 105, 163, 47, 76, 274, 153, 54, 385, 269, 165, 275, 194, 78, 113, 136, 55, 84, 58, 290, 195, 79, 277, 169, 140, 86, 59, 291, 197, 100, 281, 87, 142, 177, 61, 90, 293, 322, 148, 32, 264, 201, 102, 143, 91, 323, 150, 297, 103, 268, 106, 164, 209, 48, 93, 325, 151, 154, 386, 270, 107, 305, 166, 276, 114, 329, 155, 56, 387, 271, 225, 109, 167, 196, 80, 278, 115, 170, 157, 389, 60, 292, 337, 279, 198, 171, 117, 282, 88, 178, 62, 393, 294, 199, 173, 283, 202, 121, 144, 353, 179, 63, 92, 295, 324, 298, 203, 104, 401, 285, 181, 210, 94, 326, 152, 299, 205, 108, 306, 211, 95, 327, 185, 417, 301, 330, 156, 388, 272, 307, 226, 110, 168, 213, 116, 331, 158, 390, 227, 111, 309, 338, 280, 172, 217, 118, 449, 333, 159, 391, 229, 339, 394, 200, 313, 119, 174, 284, 122, 354, 180, 64, 395, 296, 341, 233, 175, 204, 402, 286, 123, 355, 182, 397, 300, 345, 403, 287, 206, 241, 125, 357, 183, 212, 96, 328, 186, 418, 302, 207, 405, 308, 214, 361, 187, 419, 303, 332, 228, 112, 409, 310, 215, 189, 218, 421, 450, 334, 160, 369, 392, 311, 230, 340, 314, 219, 120, 451, 335, 425, 231, 396, 342, 315, 234, 176, 221, 453, 124, 356, 343, 398, 235, 433, 317, 346, 404, 288, 242, 126, 457, 358, 184, 399, 237, 347, 208, 406, 243, 127, 359, 362, 188, 420, 465, 304, 349, 407, 245, 410, 216, 363, 190, 422, 370, 411, 312, 249, 481, 365, 191, 220, 423, 452, 336, 371, 426, 232, 413, 316, 222, 454, 427, 373, 344, 236, 434, 318, 223, 455, 429, 458, 377, 400, 435, 319, 238, 348, 244, 128, 459, 360, 239, 437, 466, 350, 408, 246, 461, 364, 467, 351, 441, 247, 412, 250, 482, 366, 192, 424, 469, 372, 414, 251, 483, 367, 428, 473, 374, 415, 253, 485, 224, 456, 375, 430, 378, 436, 320, 489, 431, 460, 379, 240, 438, 462, 497, 381, 439, 468, 352, 442, 248, 463, 470, 443, 252, 484, 368, 471, 445, 474, 416, 254, 486, 475, 376, 255, 487, 490, 432, 477, 380, 491, 498, 382, 440, 493, 464, 499, 383, 444, 501, 472, 446, 505, 447, 476, 256, 488, 478, 492, 479, 494, 500, 384, 495, 502, 503, 506, 448, 507, 509, 480, 496, 504, 508, 510, 511, 512], and a sequence generated by using the formula (10) or (11) is a sequence (8):

[1, 2, 3, 5, 9, 17, 33, 4, 6, 7, 65, 10, 11, 18, 13, 129, 19, 34, 21, 35, 25, 37, 8, 257, 66, 67, 41, 12, 69, 14, 49, 130, 20, 15, 73, 131, 22, 36, 133, 23, 81, 26, 38, 258, 137, 27, 39, 97, 259, 68, 42, 29, 145, 43, 261, 70, 50, 71, 45, 16, 265, 74, 161, 51, 132, 75, 53, 134, 24, 273, 82, 77, 135, 193, 83, 57, 138, 28, 40, 289, 98, 85, 260, 139, 30, 146, 99, 44, 262, 141, 31, 89, 147, 101, 263, 72, 321, 46, 266, 162, 52, 149, 47, 105, 267, 76, 163, 54, 274, 153, 269, 78, 165, 55, 113, 136, 385, 275, 194, 84, 58, 79, 195, 290, 169, 59, 277, 86, 140, 291, 100, 197, 87, 61, 142, 32, 281, 90, 177, 148, 293, 102, 264, 143, 322, 201, 91, 150, 103, 323, 48, 297, 106, 93, 268, 164, 151, 209, 154, 107, 325, 270, 166, 56, 305, 114, 386, 276, 155, 109, 271, 80, 329, 167, 225, 115, 387, 196, 170, 60, 278, 157, 117, 292, 171, 389, 279, 198, 88, 337, 62, 282, 178, 199, 294, 173, 63, 121, 144, 393, 283, 202, 92, 179, 295, 104, 353, 324, 203, 298, 285, 94, 181, 152, 401, 210, 299, 108, 326, 205, 95, 211, 306, 185, 156, 327, 301, 110, 272, 330, 168, 417, 307, 226, 116, 213, 388, 158, 111, 331, 227, 309, 118, 172, 390, 280, 159, 338, 217, 333, 229, 119, 391, 200, 449, 339, 174, 64, 313, 122, 394, 284, 180, 296, 175, 354, 233, 123, 341, 395, 204, 286, 182, 402, 355, 125, 300, 397, 287, 206, 96, 345, 183, 241, 403, 212, 186, 357, 328, 207, 302, 418, 308, 187, 405, 214, 303, 112, 361, 332, 419, 228, 215, 310, 189, 160, 409, 218, 334, 421, 311, 230, 120, 369, 392, 450, 340, 219, 314, 335, 231, 451, 176, 425, 315, 234, 124, 342, 221, 396, 356, 235, 453, 343, 317, 126, 398, 288, 346, 184, 433, 242, 404, 358, 237, 127, 399, 208, 457, 347, 243, 188, 406, 359, 304, 362, 349, 245, 420, 407, 216, 465, 190, 410, 363, 422, 312, 191, 370, 249, 411, 220, 365, 336, 423, 232, 481, 371, 452, 426, 316, 413, 222, 373, 427, 236, 454, 344, 223, 318, 434, 455, 429, 319, 238, 128, 377, 400, 458, 348, 435, 244, 360, 239, 459, 350, 437, 246, 408, 466, 364, 461, 351, 247, 467, 192, 441, 250, 412, 366, 424, 482, 372, 251, 469, 414, 367, 483, 374, 253, 428, 415, 224, 473, 485, 375, 456, 430, 320, 378, 436, 431, 240, 489, 379, 460, 438, 381, 462, 352, 439, 248, 497, 468, 442, 463, 443, 252, 470, 368, 484, 471, 445, 254, 416, 474, 486, 376, 255, 475, 487, 432, 490, 380, 477, 491, 382, 440, 498, 493, 383, 464, 499, 444, 501, 472, 446, 447, 256, 505, 476, 488, 478, 492, 479, 494, 384, 500, 495, 502, 503, 448, 506, 507, 509, 480, 496, 504, 508, 510, 511, 512].

If N=256:

a sequence obtained by using the formula (2) is a sequence (9):

[1, 2, 3, 5, 9, 17, 4, 33, 6, 7, 65, 10, 11, 18, 13, 19, 129, 34, 21, 35, 25, 8, 37, 66, 67, 12, 41, 69, 14, 20, 49, 130, 15, 73, 22, 131, 36, 23, 133, 81, 26, 38, 27, 137, 39, 68, 97, 42, 29, 145, 43, 70, 50, 71, 16, 45, 74, 51, 132, 161, 75, 24, 53, 134, 82, 77, 135, 83, 28, 57, 193, 138, 40, 98, 85, 30, 139, 146, 99, 44, 31, 141, 89, 147, 72, 101, 46, 52, 162, 149, 47, 76, 105, 54, 163, 153, 78, 55, 136, 165, 84, 113, 58, 194, 79, 59, 86, 195, 140, 169, 100, 87, 32, 61, 197, 142, 90, 148, 177, 102, 143, 91, 201, 150, 103, 48, 106, 93, 164, 151, 209, 154, 107, 56, 166, 114, 155, 80, 109, 167, 115, 60, 196, 225, 170, 157, 88, 117, 62, 171, 198, 178, 63, 199, 144, 173, 92, 121, 202, 179, 104, 94, 203, 152, 181, 210, 108, 95, 205, 211, 156, 185, 110, 168, 116, 226, 213, 158, 111, 118, 227, 172, 159, 217, 119, 64, 200, 229, 174, 122, 180, 175, 123, 204, 233, 182, 96, 125, 206, 183, 212, 241, 186, 207, 187, 214, 112, 228, 215, 160, 189, 218, 120, 230, 219, 231, 176, 124, 234, 221, 126, 235, 184, 242, 127, 208, 237, 243, 188, 216, 245, 191, 190, 220, 249, 232, 222, 236, 223, 128, 238, 244, 239, 246, 247, 192, 250, 251, 224, 253, 240, 248, 252, 254, 255, 256], a sequence obtained by using the formula (7) is a sequence (10):

[1, 2, 3, 5, 9, 17, 33, 4, 6, 7, 65, 10, 11, 18, 13, 129, 19, 34, 21, 35, 25, 37, 8, 66, 67, 41, 12, 69, 14, 130, 49, 20, 15, 73, 131, 22, 133, 36, 23, 81, 26, 38, 137, 27, 39, 97, 68, 42, 29, 145, 70, 43, 50, 71, 45, 16, 74, 161, 132, 51, 75, 134, 53, 24, 82, 77, 135, 193, 83, 138, 57, 28, 40, 98, 139, 85, 30, 146, 99, 141, 44, 31, 89, 147, 101, 72, 46, 162, 149, 52, 47, 105, 76, 163, 54, 153, 78, 165, 136, 194, 55, 113, 84, 58, 79, 195, 169, 140, 86, 59, 197, 100, 87, 142, 61, 32, 90, 177, 148, 102, 143, 201, 91, 150, 103, 48, 106, 164, 93, 151, 209, 154, 107, 166, 56, 114, 155, 109, 80, 167, 225, 196, 115, 170, 157, 60, 198, 171, 117, 88, 62, 178, 199, 173, 144, 202, 63, 121, 92, 179, 104, 203, 94, 181, 152, 210, 205, 108, 95, 211, 185, 156, 110, 168, 226, 213, 116, 158, 111, 227, 172, 118, 159, 217, 229, 200, 119, 174, 64, 122, 180, 175, 233, 204, 123, 182, 206, 125, 96, 183, 241, 212, 186, 207, 214, 187, 112, 228, 215, 189, 160, 218, 230, 120, 219, 231, 176, 234, 221, 124, 235, 126, 184, 242, 237, 208, 127, 243, 188, 245, 216, 190, 191, 249, 220, 232, 222, 236, 223, 238, 128, 244, 239, 246, 247, 192, 250, 251, 253, 224, 240, 248, 252, 254, 255, 256], a sequence obtained by using the formula (8) is a sequence (11):

[1, 2, 3, 5, 9, 17, 33, 4, 6, 65, 7, 10, 11, 18, 129, 13, 19, 34, 21, 35, 25, 37, 66, 8, 67, 41, 12, 69, 130, 14, 49, 20, 73, 131, 15, 22, 133, 36, 81, 23, 26, 137, 38, 27, 97, 39, 68, 42, 145, 29, 70, 43, 50, 71, 161, 45, 74, 132, 16, 51, 75, 134, 53, 82, 24, 193, 77, 135, 83, 138, 57, 28, 98, 139, 40, 85, 146, 30, 99, 141, 44, 89, 147, 31, 101, 72, 162, 46, 149, 52, 105, 163, 47, 76, 153, 54, 165, 194, 78, 113, 136, 55, 84, 58, 195, 79, 169, 140, 86, 59, 197, 100, 87, 142, 177, 61, 90, 148, 32, 201, 102, 143, 91, 150, 103, 106, 164, 209, 48, 93, 151, 154, 107, 166, 114, 155, 56, 225, 109, 167, 196, 80, 115, 170, 157, 60, 198, 171, 117, 88, 178, 62, 199, 173, 202, 121, 144, 179, 63, 92, 203, 104, 181, 210, 94, 152, 205, 108, 211, 95, 185, 156, 226, 110, 168, 213, 116, 158, 227, 111, 172, 217, 118, 159, 229, 200, 119, 174, 122, 180, 64, 233, 175, 204, 123, 182, 206, 241, 125, 183, 212, 96, 186, 207, 214, 187, 228, 112, 215, 189, 218, 160, 230, 219, 120, 231, 234, 176, 221, 124, 235, 242, 126, 184, 237, 208, 243, 127, 188, 245, 216, 190, 249, 191, 220, 232, 222, 236, 223, 238, 244, 128, 239, 246, 247, 250, 192, 251, 253, 224, 240, 248, 252, 254, 255, 256], and a sequence generated by using the formula (10) or (11) is a sequence (12):

[1, 2, 3, 5, 9, 17, 33, 4, 6, 7, 65, 10, 11, 18, 13, 129, 19, 34, 21, 35, 25, 37, 8, 66, 67, 41, 12, 69, 14, 49, 130, 20, 15, 73, 131, 22, 36, 133, 23, 81, 26, 38, 137, 27, 39, 97, 68, 42, 29, 145, 43, 70, 50, 71, 45, 16, 74, 161, 51, 132, 75, 53, 134, 24, 82, 77, 135, 193, 83, 57, 138, 28, 40, 98, 85, 139, 30, 146, 99, 44, 141, 31, 89, 147, 101, 72, 46, 162, 52, 149, 47, 105, 76, 163, 54, 153, 78, 165, 55, 113, 136, 194, 84, 58, 79, 195, 169, 59, 86, 140, 100, 197, 87, 61, 142, 32, 90, 177, 148, 102, 143, 201, 91, 150, 103, 48, 106, 93, 164, 151, 209, 154, 107, 166, 56, 114, 155, 109, 80, 167, 225, 115, 196, 170, 60, 157, 117, 171, 198, 88, 62, 178, 199, 173, 63, 121, 144, 202, 92, 179, 104, 203, 94, 181, 152, 210, 108, 205, 95, 211, 185, 156, 110, 168, 226, 116, 213, 158, 111, 227, 118, 172, 159, 217, 229, 119, 200, 174, 64, 122, 180, 175, 233, 123, 204, 182, 125, 206, 96, 183, 241, 212, 186, 207, 187, 214, 112, 228, 215, 189, 160, 218, 230, 120, 219, 231, 176, 234, 124, 221, 235, 126, 184, 242, 237, 127, 208, 243, 188, 245, 216, 190, 191, 249, 220, 232, 222, 236, 223, 238, 128, 244, 239, 246, 247, 192, 250, 251, 253, 224, 240, 248, 252, 254, 255, 256].

If N=128:

a sequence obtained by using the formula (2) is a sequence (13):

[1, 2, 3, 5, 9, 17, 4, 33, 6, 7, 65, 10, 11, 18, 13, 19, 34, 21, 35, 25, 8, 37, 66, 67, 12, 41, 69, 14, 20, 49, 15, 73, 22, 36, 23, 81, 26, 38, 27, 39, 68, 97, 42, 29, 43, 70, 50, 71, 16, 45, 74, 51, 75, 24, 53, 82, 77, 83, 28, 57, 40, 98, 85, 30, 99, 44, 31, 89, 72, 101, 46, 52, 47, 76, 105, 54, 78, 55, 84, 113, 58, 79, 59, 86, 100, 87, 32, 61, 90, 102, 91, 103, 48, 106, 93, 107, 56, 114, 80, 109, 115, 60, 88, 117, 62, 63, 92, 121, 104, 94, 108, 95, 110, 116, 111, 118, 119, 64, 122, 123, 96, 125, 112, 120, 124, 126, 127, 128], a sequence obtained by using the formula (7) is a sequence (14):

[1, 2, 3, 5, 9, 17, 33, 4, 6, 7, 65, 10, 11, 18, 13, 19, 34, 21, 35, 25, 37, 8, 66, 67, 41, 12, 69, 14, 49, 20, 15, 73, 22, 36, 23, 81, 26, 38, 27, 39, 97, 68, 42, 29, 70, 43, 50, 71, 45, 16, 74, 51, 75, 53, 24, 82, 77, 83, 57, 28, 40, 98, 85, 30, 99, 44, 31, 89, 101, 72, 46, 52, 47, 105, 76, 54, 78, 55, 113, 84, 58, 79, 86, 59, 100, 87, 61, 32, 90, 102, 91, 103, 48, 106, 93, 107, 56, 114, 109, 80, 115, 60, 117, 88, 62, 63, 121, 92, 104, 94, 108, 95, 110, 116, 111, 118, 119, 64, 122, 123, 125, 96, 112, 120, 124, 126, 127, 128], a sequence obtained by using the formula (8) is a sequence (15):

[1, 2, 3, 5, 9, 17, 33, 4, 6, 65, 7, 10, 11, 18, 13, 19, 34, 21, 35, 25, 37, 66, 8, 67, 41, 12, 69, 14, 49, 20, 73, 15, 22, 36, 81, 23, 26, 38, 27, 97, 39, 68, 42, 29, 70, 43, 50, 71, 45, 74, 16, 51, 75, 53, 82, 24, 77, 83, 57, 28, 98, 40, 85, 30, 99, 44, 89, 31, 101, 72, 46, 52, 105, 47, 76, 54, 78, 113, 55, 84, 58, 79, 86, 59, 100, 87, 61, 90, 32, 102, 91, 103, 106, 48, 93, 107, 114, 56, 109, 80, 115, 60, 117, 88, 62, 121, 63, 92, 104, 94, 108, 95, 110, 116, 111, 118, 119, 122, 64, 123, 125, 96, 112, 120, 124, 126, 127, 128], and a sequence obtained by using the formula (10) or (11) is a sequence (16):

[1, 2, 3, 5, 9, 17, 33, 4, 6, 7, 65, 10, 11, 18, 13, 19, 34, 21, 35, 25, 37, 8, 66, 67, 41, 12, 69, 14, 49, 20, 15, 73, 22, 36, 23, 81, 26, 38, 27, 39, 97, 68, 42, 29, 43, 70, 50, 71, 45, 16, 74, 51, 75, 53, 24, 82, 77, 83, 57, 28, 40, 98, 85, 30, 99, 44, 31, 89, 101, 72, 46, 52, 47, 105, 76, 54, 78, 55, 113, 84, 58, 79, 59, 86, 100, 87, 61, 32, 90, 102, 91, 103, 48, 106, 93, 107, 56, 114, 109, 80, 115, 60, 117, 88, 62, 63, 121, 92, 104, 94, 108, 95, 110, 116, 111, 118, 119, 64, 122, 123, 125, 96, 112, 120, 124, 126, 127, 128].

If N=64:

a sequence obtained by using the formula (2) is a sequence (17):

[1, 2, 3, 5, 9, 17, 4, 33, 6, 7, 10, 11, 18, 13, 19, 34, 21, 35, 25, 8, 37, 12, 41, 14, 20, 49, 15, 22, 36, 23, 26, 38, 27, 39, 42, 29, 43, 50, 16, 45, 51, 24, 53, 28, 57, 40, 30, 44, 31, 46, 52, 47, 54, 55, 58, 59, 32, 61, 48, 56, 60, 62, 63, 64], a sequence obtained by using the formula (7) is a sequence (18):

[1, 2, 3, 5, 9, 17, 33, 4, 6, 7, 10, 11, 18, 13, 19, 34, 21, 35, 25, 37, 8, 41, 12, 14, 49, 20, 15, 22, 36, 23, 26, 38, 27, 39, 42, 29, 43, 50, 45, 16, 51, 53, 24, 57, 28, 40, 30, 44, 31, 46, 52, 47, 54, 55, 58, 59, 61, 32, 48, 56, 60, 62, 63, 64], a sequence obtained by using the formula (8) is a sequence (19):

[1, 2, 3, 5, 9, 17, 33, 4, 6, 7, 10, 11, 18, 13, 19, 34, 21, 35, 25, 37, 8, 41, 12, 14, 49, 20, 15, 22, 36, 23, 26, 38, 27, 39, 42, 29, 43, 50, 45, 16, 51, 53, 24, 57, 28, 40, 30, 44, 31, 46, 52, 47, 54, 55, 58, 59, 61, 32, 48, 56, 60, 62, 63, 64], and a sequence obtained by using the formula (10) or (11) is a sequence (20):

[1, 2, 3, 5, 9, 17, 33, 4, 6, 7, 10, 11, 18, 13, 19, 34, 21, 35, 25, 37, 8, 41, 12, 14, 49, 20, 15, 22, 36, 23, 26, 38, 27, 39, 42, 29, 43, 50, 45, 16, 51, 53, 24, 57, 28, 40, 30, 44, 31, 46, 52, 47, 54, 55, 58, 59, 61, 32, 48, 56, 60, 62, 63, 64].

It should be noted that the foregoing sequences are merely examples, and application of the sequences to a polar encoding process helps improve encoding/decoding performance of a polar code. For any exemplified sequence, on a premise of not affecting an overall effect of the sequence, adjustments or equivalent replacements in the following several aspects may be included but are not limited:

1. Locations of fewer elements in the sequence are exchanged. For example, a sequence number location may be adjusted by a specified magnitude, for example, the specified magnitude is 5. A location of an element whose sequence number is 10 may be adjusted by left and right five locations.

2. Some elements in the sequence are adjusted, but channel sets that are used to transmit T-bit information and that are selected based on the sequence are consistent or similar.

3. The sequence includes N elements from 1 to N, and the N elements from 1 to N represent sequence numbers of N polar channels. Actually, the sequence numbers of the N polar channels may alternatively start from 0 and end up with N−1, that is, subtracting 1 from the sequence numbers in the foregoing sequence. This is also a sequence number form in the foregoing computation manner. Certainly, a sequence number or an identifier of the polar channel may alternatively be represented in another manner. The specific representation manner does not affect a specific location of the polar channel in the sequence.

4. Sequence numbers of N polar channels in the sequence are arranged in descending order of reliability of the N polar channels. Actually, sequence numbers of N polar channels may alternatively be arranged in ascending order of reliability of the N polar channels. That is, elements in the foregoing sequence are arranged in reverse order or in inverse order.

5. The foregoing sequence may alternatively be represented by using normalized reliability sequences or equivalent reliability sequences of various channels. For example, a sorting location of a channel x in the foregoing sequence is n (where the leftmost location is denoted as 1). In this case, reliability of the channel may be represented as n or normalized n/N, where N is a length of the sequence.

Figure 3:
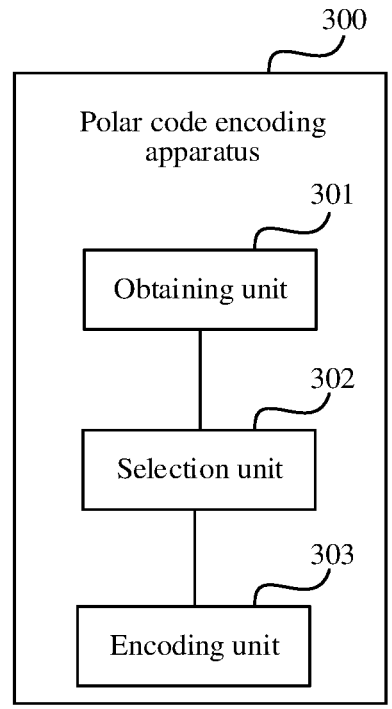
FIG. 3 is a first schematic structural diagram of a polar code encoding apparatus according to an embodiment of this application.

Based on the polar code encoding method shown in FIG. 2, as shown in FIG. 3, an embodiment of this application further provides a polar code encoding apparatus 300. The polar code encoding apparatus 300 is configured to perform the polar code encoding method shown in FIG. 2. The polar code encoding apparatus 300 includes:

an obtaining unit 301, configured to obtain a first sequence used to encode K to-be-encoded bits, where the first sequence includes sequence numbers of N polar channels, and the sequence numbers of the N polar channels are arranged in the first sequence based on reliability of the N polar channels, where K is a positive integer, N is a mother code length of a polar code, N is a positive integer power of 2, and K≤N, a selection unit 302, configured to select sequence numbers of K polar channels from the first sequence in descending order of the reliability, and an encoding unit 303, configured to: place the to-be-encoded bits based on the selected sequence numbers of the K polar channels, and perform polar code encoding on the to-be-encoded bits.

The first sequence may be any one of the sequences exemplified above, and reliability of an $i^{th}$ polar channel in the N polar channels may also be determined by using any one of the foregoing exemplified formulas.

Figure 4:
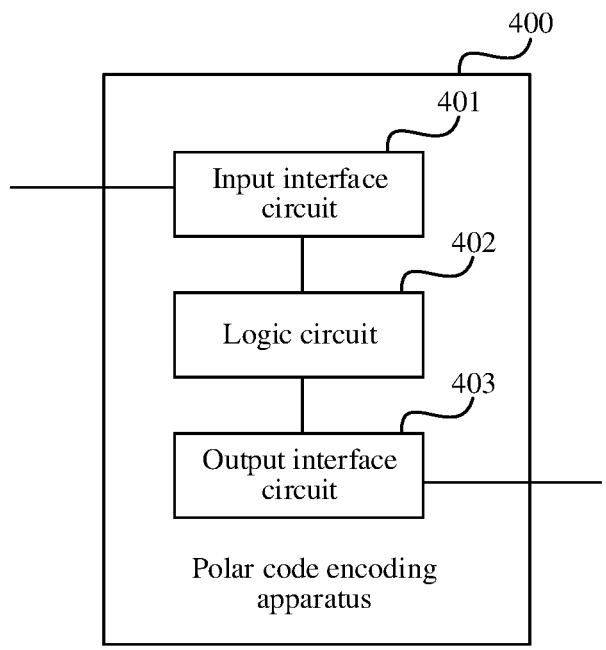
FIG. 4 is a second schematic structural diagram of a polar code encoding apparatus according to an embodiment of this application.

Based on a same inventive concept of the polar code encoding method shown in FIG. 2, as shown in FIG. 4, an embodiment of this application further provides a polar code encoding apparatus 400. The polar code encoding apparatus 400 is configured to perform the polar code encoding method shown in FIG. 2. A part or all of the polar code encoding method shown in FIG. 2 may be implemented by using hardware or software. When the hardware is used for implementation, the polar code encoding apparatus 400 includes: an input interface circuit 401, configured to obtain to-be-encoded bits, a logical circuit 402, configured to perform the polar code encoding method shown in FIG. 2, where for details, refer to the descriptions in the foregoing method embodiment, and details are not described herein again, and an output interface circuit 403, configured to output an encoded bit sequence.

Optionally, during specific implementation, the polar code encoding apparatus 400 may be a chip or an integrated circuit.

Figure 5:
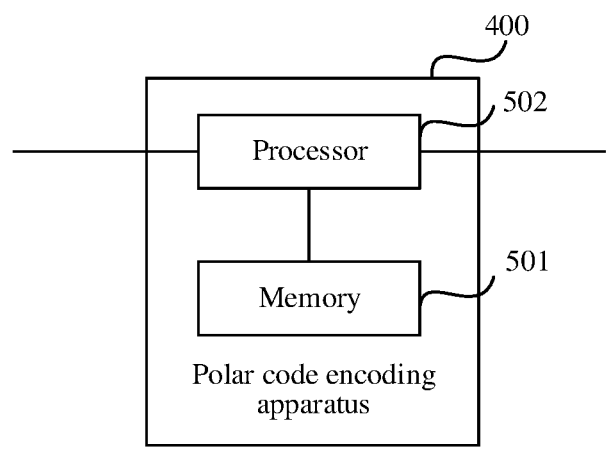
FIG. 5 is a third schematic structural diagram of a polar code encoding apparatus according to an embodiment of this application.

Optionally, when a part or all of the polar code encoding method in the foregoing embodiment is implemented by using software, as shown in FIG. 5, the polar code encoding apparatus 400 includes: a memory 501, configured to store a program, and a processor 502, configured to execute the program stored in the memory 501, where when the program is executed, the polar code encoding apparatus 400 may implement the polar code encoding method provide in the embodiment in FIG. 2.

Figure 6:
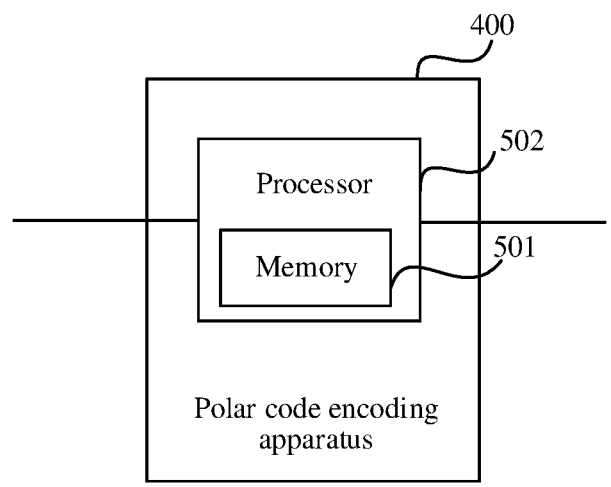
FIG. 6 is a fourth schematic structural diagram of a polar code encoding apparatus according to an embodiment of this application.

Optionally, the memory 501 may be a physically independent unit. Alternatively, as shown in FIG. 6, a memory 501 and a processor 502 may be integrated together.

Optionally, when a part or all of the encoding method in the embodiment in FIG. 2 is implemented by using software, the polar code encoding apparatus 400 may alternatively include only a processor 502. A memory 501 configured to store a program is located outside of the polar code encoding apparatus 400, and the processor 502 is connected to the memory 501 by using a circuit/a cable, and is configured to read and execute the program stored in the memory 501.

The processor 502 may be a central processing unit (CPU), a network processor (NP), or a combination of a CPU and an NP.

The processor 502 may further include a hardware chip. The foregoing hardware chip may be an application-specific integrated circuit (ASIC), a programmable logic device (PLD), or a combination thereof. The PLD may be a complex programmable logic device (CPLD), a field-programmable gate array (FPGA), a generic array logic (GAL), or any combination thereof.

The memory 501 may include a volatile memory, for example, a random-access memory (RAM). The memory 501 may also include a non-transitory or non-volatile memory, such as a flash memory, a hard disk drive (HDD), or a solid-state drive (SSD). Alternatively, the memory 501 may include a combination of the foregoing types of memories.

An embodiment of this application further provides a computer storage medium, storing a computer program, where the computer program is used to perform the polar code encoding method shown in FIG. 2.

An embodiment of this application further provides a computer program product including an instruction. When the computer program product is run on a computer, the computer is enabled to perform the polar code encoding method shown in FIG. 2.

Persons skilled in the art should understand that the embodiments of this application may be provided as a method, a system, or a computer program product. Therefore, this application may use a form of hardware only embodiments, software only embodiments, or embodiments with a combination of software and hardware. Moreover, this application may use a form of a computer program product that is implemented on one or more computer-usable storage media (including but not limited to a disk memory, a CD-ROM, an optical memory, and the like) that include computer usable program code.

This application is described with reference to the flowcharts and/or block diagrams of the method, the device (system), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Although some preferred embodiments of this application have been described, persons skilled in the art can make changes and modifications to these embodiments once they learn the basic inventive concept. Therefore, the following claims are intended to be construed as to cover the preferred embodiments and all changes and modifications falling within the scope of this application.

Obviously, persons skilled in the art can make various modifications and variations to the embodiments of this application without departing from the scope of the embodiments of this application. This application is intended to cover these modifications and variations provided that they fall within the scope of protection defined by the following claims and their equivalent technologies.

What is claimed is:

1. A polar code encoding method, comprising:
obtaining a first sequence used to encode K to-be-encoded bits, wherein the first sequence comprises sequence numbers of N polar channels, wherein the sequence numbers of the N polar channels are arranged in the first sequence according to reliability of the N polar channels, wherein K is a positive integer, wherein N is a mother code length of a polar code, wherein N is a positive integer power of 2, wherein K≤N, and wherein the reliability of an $i^{th}$ polar channel in the N polar channels is determined according to a reliability computation formula comprising at least one of a weight value of each order term of the reliability computation formula or one or more weights of one or more kernel functions of the reliability computation formula;
selecting sequence numbers of K polar channels from the first sequence in descending order of the reliability; and
placing the to-be-encoded bits according to the selected sequence numbers of the K polar channels, and performing polar code encoding on the to-be-encoded bits.

2. The method according to claim 1, wherein the reliability computation formula is a first reliability computation formula; and
wherein the first reliability computation formula is:

$$W_i = \sum_{j=0}^{n-1} B_j \times \left( \sum_{\xi \in \Xi} C(\xi, j) \Psi(\xi, j)^{E(\xi)j} \right),$$

wherein 1≤i≤N; $W_i$ is the reliability of the $i^{th}$ polar channel, wherein n=Log$_2$N, wherein i meets i−1= $B_{n-1}B_{n-2} \ldots B_0$, wherein $B_{n-1}B_{n-2} \ldots B_1B_0$ is a binary representation of i−1, wherein $B_j$ is a value of a $j^{th}$ bit of a binary representation of a channel sequence number i, wherein $B_j \in \{0,1\}$, wherein Ξ is a set of ξ orders comprised in the first reliability computation formula, wherein C(ξ,j) is a function of ξ and j and represents a weight value of each order term, wherein Ψ(ξ,j) is a function of ξ and j, and wherein E(ξ) is a function of ξ, and represents a frequency at which a $\xi^{th}$-order kernel function Ψ(ξ,j) varies with j.

3. The method according to claim 1, wherein the reliability computation formula is a second reliability computation formula; and wherein the second reliability computation formula is:

$$W_i = \sum_{j=0}^{n-1} B_j \times \left(\sum_{\xi \in \Xi} C(\xi)\beta^{E(\xi)j}\right),$$ 5 wherein $1 \leq i \leq N$, wherein $W_i$ is the reliability of the $i^{th}$ polar channel, wherein $n = \log_2 N$, wherein i meets $i-1 = B_{n-1}B_{n-2} \ldots B_0$, wherein $B_{n-1}B_{n-2} \ldots B_1B_0$ is a binary representation of i−1, wherein $B_j$ is a value of a $j^{th}$ bit of a binary representation of a channel sequence number i, wherein $B_j \in \{0,1\}$, wherein $\Xi$ is a set of $\xi$ orders comprised in the second reliability computation formula, wherein $C(\xi)$ is a function of $\xi$, and represents a weight value of each order term, wherein $\beta$ is a constant greater than 1, and wherein $E(\xi)$ is a function of $\xi$, and represents a frequency at which a $\xi^{th}$-order $\beta$ kernel varies with j.

4. The method according to claim 1, wherein the reliability computation formula is a third reliability computation formula; and
wherein the third reliability computation formula is:

$$W_i = \sum_{j=0}^{n-1} B_j \times \left(\sum_{\xi \in \Xi} C(\xi)\beta^{\frac{1}{4\xi}j}\right),$$ 30 wherein $1 \leq i \leq N$, wherein $W_i$ is the reliability of the $i^{th}$ polar channel, wherein $n = \log_2 N$, wherein i meets $i-1 = B_{n-1}B_{n-2} \ldots B_0$, wherein $B_{n-1}B_{n-2} \ldots B_1B_0$ is a binary representation of i−1, wherein $B_j$ is a value of a $j^{th}$ bit of a binary representation of a channel sequence number i, wherein $B_j \in \{0,1\}$, wherein $\Xi$ is a set of $\xi$ orders comprised in the third reliability computation formula, and wherein $C(\xi)$ is a function of $\xi$, and represents a weight value of each order term; and $\beta$ is a constant greater than 1.

5. The method according to claim 1, wherein the reliability computation formula is a fourth reliability computation formula; and
wherein the fourth reliability computation formula is:

$$W_i = \sum_{j=0}^{n-1} B_j \times \left(\sum_{\xi \in \Xi_1, \xi \notin \Xi_2} C(\xi)B^{E(\xi)j} + \sum_{\xi \in \Xi_2, \xi \notin \Xi_1} C(\xi)\Psi(\xi,j)^{E(\xi)j}\right),$$ 50 wherein $1 \leq i \leq N$, wherein $W_i$ is the reliability of the $i^{th}$ polar channel, wherein $n = \log_2 N$, wherein i meets $i-1 = B_{n-1}B_{n-2} \ldots B_0$, wherein $B_{n-1}B_{n-2} \ldots B_1B_0$ is a binary representation of i−1, wherein $B_j$ is a value of a $j^{th}$ bit of a binary representation of a channel sequence number i, wherein $B_j \in \{0,1\}$, wherein $\Xi$ and $\Xi_2$ are sets of $\xi$ orders in the fourth reliability computation formula, wherein $C(\xi)$ is a function of $\xi$, and represents a weight value of each order term, wherein $\Psi(\xi,j)$ is a function of $\xi$ and j, wherein $\beta$ is a constant greater than 1, and wherein $E(\xi)$ is a function of $\xi$, and represents a frequency at which a $\xi^{th}$-order $\beta$ kernel varies with j or a frequency at which a $\xi^{th}$-order kernel function $\Psi(\xi,j)$ varies with j.

6. The method according to claim 1, wherein the reliability computation formula is a fifth reliability computation formula; and
the fifth reliability computation formula is:

$$W_i = \sum_{j=0}^{n-1} B_j \times (C(j) \times \Psi(j)^{E \times j}),$$

wherein $1 \leq i \leq N$, wherein $W_i$ is the reliability of the $i^{th}$ polar channel, wherein $n = \log_2 N$, wherein i meets $i-1 = B_{n-1}B_{n-2} \ldots B_0$, wherein $B_{n-1}B_{n-2} \ldots B_1B_0$ is a binary representation of i−1, wherein $B_j$ is a value of a $j^{th}$ bit of a binary representation of a channel sequence number i, wherein $B_j \in \{0,1\}$, wherein $C(j)$ is a constant, and represents a weight value of each order term, wherein and E is a constant, and represents a frequency at which a kernel function $\Psi(j)$ varies with j, and wherein the kernel function $\Psi(j)$ is a function of j.

7. The method according to claim 1, wherein the reliability computation formula is a sixth reliability computation formula; and
wherein the sixth reliability computation formula is:

$$W_i = \sum_{j=0}^{n-1} \left(B_j \times (\beta^j + a \times b^j) + \left(\prod_{k \in K} B_k\right) \times B_j \times (\beta^j + c \times d^j)\right),$$

wherein $1 \leq i \leq N$, wherein $W_i$ is the reliability of the $i^{th}$ polar channel, wherein $n = \log_2 N$, wherein i meets $i-1 = B_{n-1}B_{n-2} \ldots B_0$, wherein $B_{n-1}B_{n-2} \ldots B_1B_0$ is a binary representation of i−1, wherein $B_j$ is a value of a $j^{th}$ bit of a binary representation of a channel sequence number i, wherein $B_j \in \{0,1\}$, wherein $\beta$ is a constant greater than 1, wherein K is a set comprising binary representation bits of the channel sequence number i, wherein K is a subset of a set $\{0, 1, \ldots, n-1\}$, and a size Size(K) of K meets $0 \leq \text{Size}(K) \leq n-1$, wherein a is a weight of a kernel function b, and wherein c is a weight of a kernel function d.

8. The method according to claim 3, wherein $\beta = 2^{1/4}$.

9. The method according to claim 1, wherein the first sequence is a second sequence or a subset of a second sequence, the second sequence comprises sequence numbers of $N_{max}$ polar channels, and the sequence numbers of the $N_{max}$ polar channels are arranged in the second sequence according to reliability of the $N_{max}$ polar channels, wherein $N_{max}$ is a positive integer power of 2, and wherein $N_{max} \geq N_{max}$.

10. A polar code encoding apparatus, comprising:
at least one processor; and
at least one non-transitory memory storing a program for execution by the at least one processor, the program including instructions for:
obtaining a first sequence used to encode K to-be-encoded bits, wherein the first sequence comprises sequence numbers of N polar channels, wherein the sequence numbers of the N polar channels are arranged in the first sequence according to reliability of the N polar channels, wherein K is a positive integer, N is a mother code length of a polar code, wherein N is a positive integer power of 2, wherein $K \leq N$, and wherein the reliability of an $i^{th}$ polar channel in the N polar channels is determined according to a reliability computation formula comprising at least one of a weight value of each order term of the reliability computation formula or one or more weights of one or more kernel functions of the reliability computation formula;

selecting sequence numbers of K polar channels from the first sequence in descending order of the reliability; and placing the to-be-encoded bits according to the selected sequence numbers of the K polar channels, and polar code encoding on the to-be-encoded bits.

11. The apparatus according to claim 10, wherein the reliability computation formula is a first reliability computation formula; and wherein the first reliability computation formula is:

$$W_i = \sum_{j=0}^{n-1} B_j \times \left( \sum_{\xi \in \Xi} C(\xi, j) \Psi(\xi, j)^{E(\xi)j} \right),$$

wherein $1 \leq i \leq N$, wherein $W_i$ is the reliability of the $i^{th}$ polar channel, wherein $n = \log_2 N$, wherein $i$ meets $i-1 = B_{n-1} B_{n-2} \ldots B_0$, wherein $B_{n-1} B_{n-2} \ldots B_1 B_0$ is a binary representation of $i-1$, wherein $B_j$ is a value of a $j^{th}$ bit of a binary representation of a channel sequence number $i$, wherein $B_j \in \{0,1\}$, wherein $\Xi$ is a set of $\xi$ orders comprised in the first reliability computation formula, wherein $C(\xi,j)$ is a function of $\xi$ and $j$, and represents a weight value of each order term, wherein $\Psi(\xi,j)$ is a function of $\xi$ and $j$, and wherein $E(\xi)$ is a function of $\xi$, and represents a frequency at which a $\xi^{th}$-order kernel function $\Psi(\xi,j)$ varies with $j$.

12. The apparatus according to claim 10, wherein the reliability computation formula is a second reliability computation formula; and wherein the second reliability computation formula is:

$$W_i = \sum_{j=0}^{n-1} B_j \times \left( \sum_{\xi \in \Xi} C(\xi) \beta^{E(\xi)j} \right),$$

wherein $1 \leq i \leq N$, wherein $W_i$ is the reliability of the $i^{th}$ polar channel, wherein $n = \log_2 N$, wherein $i$ meets $i-1 = B_{n-1} B_{n-2} \ldots B_0$, wherein $B_{n-1} B_{n-2} \ldots B_1 B_0$ is a binary representation of $i-1$, wherein $B_j$ is a value of a $j^{th}$ bit of a binary representation of a channel sequence number $i$, wherein $B_j \in \{0,1\}$, wherein $\Xi$ is a set of $\xi$ orders comprised in the second reliability computation formula, wherein $C(\xi)$ is a function of $\xi$, and represents a weight value of each order term, wherein $\beta$ is a constant greater than 1, and wherein $E(\xi)$ is a function of $\xi$, and represents a frequency at which a $\xi^{th}$-order $\beta$ kernel varies with $j$.

13. The apparatus according to claim 10, wherein the reliability computation formula is a third reliability computation formula; and wherein the third reliability computation formula is:

$$W_i = \sum_{j=0}^{n-1} B_j \times \left( \sum_{\xi \in \Xi} C(\xi) \beta^{\frac{1}{4\xi}j} \right),$$

wherein $1 \leq i \leq N$, wherein $W_i$ is the reliability of the $i^{th}$ polar channel, wherein $n = \log_2 N$, wherein $i$ meets $i-1 = B_{n-1} B_{n-2} \ldots B_0$, wherein $B_{n-1} B_{n-2} \ldots B_1 B_0$ is a binary representation of $i-1$, wherein $B_j$ is a value of a $j^{th}$ bit of a binary representation of a channel sequence number $i$, wherein $B_j \in \{0,1\}$, wherein $\Xi$ is a set of $\xi$ orders comprised in the third reliability computation formula, and wherein $C(\xi)$ is a function of $\xi$, and represents a weight value of each order term, wherein and $\beta$ is a constant greater than 1.

14. The apparatus according to claim 10, wherein the reliability computation formula is a fourth reliability computation formula; and wherein the fourth reliability computation formula is:

$$W_i = \sum_{j=0}^{n-1} B_j \times \left( \sum_{\xi \in \Xi_1, \xi \notin \Xi_2} C(\xi) \beta^{E(\xi)j} + \sum_{\xi \in \Xi_2, \xi \notin \Xi_1} C(\xi) \Psi(\xi, j)^{E(\xi)j} \right),$$

wherein $1 \leq i \leq N$, wherein $W_i$ is the reliability of the $i^{th}$ polar channel, wherein $n = \log_2 N$, wherein $i$ meets $i-1 = B_{n-1} B_{n-2} \ldots B_0$, wherein $B_{n-1} B_{n-2} \ldots B_1 B_0$ is a binary representation of $i-1$, wherein $B_j$ is a value of a $j^{th}$ bit of a binary representation of a channel sequence number $i$, wherein $B_j \in \{0,1\}$, wherein $\Xi$ and $\Xi_2$ are sets of $\xi$ orders in the fourth reliability computation formula, wherein $C(\xi)$ is a function of $\xi$, and represents a weight value of each order term, wherein $\Psi(\xi,j)$ is a function of $\xi$ and $j$, wherein $\beta$ is a constant greater than 1, and wherein $E(\xi)$ is a function of $\xi$, and represents a frequency at which a $\xi^{th}$-order $\beta$ kernel varies with $j$ or a frequency at which a $\xi^{th}$-order kernel function $\Psi(\xi, j)$ varies with $j$.

15. The apparatus according to claim 10, wherein the reliability computation formula is a fifth reliability computation formula; and wherein the fifth reliability computation formula is:

$$W_i = \sum_{j=0}^{n-1} B_j \times (C(j) \times \Psi(j)^{E \times j}),$$

wherein $1 \leq i \leq N$, wherein $W_i$ is the reliability of the $i^{th}$ polar channel, wherein $n = \log_2 N$, wherein $i$ meets $i-1 = B_{n-1} B_{n-2} \ldots B_0$, wherein $B_{n-1} B_{n-2} \ldots B_1 B_0$ is a binary representation of $i-1$, wherein $B_j$ is a value of a $j^{th}$ bit of a binary representation of a channel sequence number $i$, wherein $B_j \in \{0,1\}$, wherein $C(j)$ is a constant, and represents a weight value of each order term, wherein and E is a constant, and represents a frequency at which a kernel function $\Psi(j)$ varies with $j$, wherein the kernel function $\Psi(j)$ is a function of $j$.

16. The apparatus according to claim 10, wherein the reliability computation formula is a sixth reliability computation formula; and wherein the sixth reliability computation formula is:

$$W_i = \sum_{j=0}^{n-1} \left( B_j \times (\beta^j + a \times b^j) + \left( \prod_{k \in K} B_k \right) \times B_j \times (\beta^j + c \times d^j) \right),$$

wherein $1 \leq i \leq N$, wherein $W_i$ is the reliability of the $i^{th}$ polar channel, wherein $n=\text{Log}_2 N$, wherein i meets $i-1=B_{n-1}B_{n-2}\ldots B_0$, wherein $B_{n-1}B_{n-2}\ldots B_1 B_0$ is a binary representation of i−1, wherein $B_j$ is a value of a $j^{th}$ bit of a binary representation of a channel sequence number i, wherein $B_j \in \{0,1\}$, wherein β is a constant greater than 1, wherein K is a set comprising binary representation bits of the channel sequence number i, wherein K is a subset of a set $\{0, 1, \ldots, n-1\}$, and a size Size(K) of K meets $0 \leq \text{Size}(K) \leq n-1$, and wherein a is a weight of a kernel function b, wherein and c is a weight of a kernel function d.

17. The apparatus according to claim 12, wherein $\beta=2^{1/4}$.

18. The apparatus according to claim 10, wherein the first sequence is a second sequence or a subset of a second sequence, wherein the second sequence comprises sequence numbers of $N_{max}$ polar channels, wherein the sequence numbers of the $N_{max}$ polar channels are arranged in the second sequence according to reliability of the $N_{max}$ polar channels, wherein $N_{max}$ is a positive integer power of 2, and wherein $N_{max} \geq N$.

19. The apparatus according to claim 10, wherein the polar code encoding apparatus is a chip or an integrated circuit.

20. A polar code encoding apparatus, comprising:
an input interface circuit for obtaining K to-be-encoded bits;
a logical circuit for:
  obtaining a first sequence used to encode the K to-be-encoded bits, wherein the first sequence comprises sequence numbers of N polar channels, wherein the sequence numbers of the N polar channels are arranged in the first sequence according to reliability of the N polar channels, wherein K is a positive integer, wherein N is a mother code length of a polar code, wherein N is a positive integer power of 2, wherein $K \leq N$, and wherein the reliability of an $i^{th}$ polar channel in the N polar channels is determined according to a reliability computation formula comprising at least one of a weight value of each order term of the reliability computation formula or one or more weights of one or more kernel functions of the reliability computation formula;
  selecting sequence numbers of K polar channels from the first sequence in descending order of the reliability; and
  placing the to-be-encoded bits according to the selected sequence numbers of the K polar channels, and performing polar code encoding on the to-be-encoded bits to obtain encoded bit sequence; and
an output interface circuit for outputting the encoded bit sequence.

* * * * *